United States Patent
Akagi et al.

(10) Patent No.: US 12,204,240 B2
(45) Date of Patent: Jan. 21, 2025

(54) REFLECTIVE MASK BLANK, REFLECTIVE MASK, METHOD OF MANUFACTURING REFLECTIVE MASK BLANK, AND METHOD OF MANUFACTURING REFLECTIVE MASK

(71) Applicant: AGC Inc., Tokyo (JP)

(72) Inventors: Daijiro Akagi, Tokyo (JP); Shunya Taki, Fukushima (JP); Takuma Kato, Tokyo (JP); Ichiro Ishikawa, Tokyo (JP); Kenichi Sasaki, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/394,787

(22) Filed: Dec. 22, 2023

(65) Prior Publication Data

US 2024/0176224 A1    May 30, 2024

Related U.S. Application Data

(63) Continuation of application No. 18/346,563, filed on Jul. 3, 2023, now Pat. No. 11,914,284, which is a continuation of application No. PCT/JP2022/044842, filed on Dec. 6, 2022.

(30) Foreign Application Priority Data

| Dec. 13, 2021 | (JP) | ................................. 2021-201671 |
| Jul. 5, 2022 | (JP) | ................................. 2022-108641 |

(51) Int. Cl.
| G03F 1/24 | (2012.01) |
| G03F 1/32 | (2012.01) |
| G03F 1/48 | (2012.01) |
| G03F 1/80 | (2012.01) |

(52) U.S. Cl.
CPC .................. *G03F 1/24* (2013.01); *G03F 1/32* (2013.01); *G03F 1/48* (2013.01); *G03F 1/80* (2013.01)

(58) Field of Classification Search
CPC ..... G03F 1/24; G03F 1/32; G03F 1/48; G03F 1/80
USPC ............................................................ 430/5
See application file for complete search history.

(56) References Cited

U.S. PATENT DOCUMENTS

| 2017/0038673 A1 | 2/2017 | Ikebe et al. |
| 2018/0329285 A1 | 11/2018 | Hamamoto et al. |
| 2019/0384158 A1 | 12/2019 | Ikebe et al. |
| 2021/0208498 A1 | 7/2021 | Ikebe et al. |
| 2022/0035234 A1 | 2/2022 | Akagi |
| 2023/0076438 A1 | 3/2023 | Fukasawa et al. |
| 2023/0251564 A1 | 8/2023 | Taki |

FOREIGN PATENT DOCUMENTS

| JP | 2015-122468 | 7/2015 |
| JP | 2015-142083 | 8/2015 |
| JP | 2016-122684 | 7/2016 |
| JP | 2018-146945 | 9/2018 |
| JP | 2021-081644 | 5/2021 |
| JP | 6929983 | 9/2021 |
| KR | 10-2014-0066563 | 6/2014 |
| WO | WO2019/225736 | 11/2019 |

OTHER PUBLICATIONS

Handbook of X-Ray Photoelectron Spectroscopy, (edited by C.D. Wagner, W.M. Riggs, L.E. Davis, J.F. Moulder, and G.E. Muilenberg), 1979.

*Primary Examiner* — Christopher G Young
(74) *Attorney, Agent, or Firm* — Oblon, McClelland, Maier & Neustadt, L.L.P.

(57) ABSTRACT

A reflective mask blank includes a substrate; a multilayer reflective film that reflects EUV light; a protection film that protects the multilayer reflective film; and a phase shift film that shifts a phase of the EUV light, the substrate, the multilayer reflective film, the protection film, and the phase shift film being arranged in this order. The phase shift film contains at least one first element X1 selected from the first group consisting of ruthenium (Ru), iridium (Ir), platinum (Pt), palladium (Pd), and gold (Au), and at least one second element X2 selected from the second group consisting of oxygen (O), boron (B), carbon (C), and nitrogen (N). In the phase shift film, a chemical shift of a peak of $3d_{5/2}$ or a peak of $4f_{7/2}$ of the first element X1 observed by X-ray electron spectroscopy is less than 0.3 eV.

16 Claims, 9 Drawing Sheets

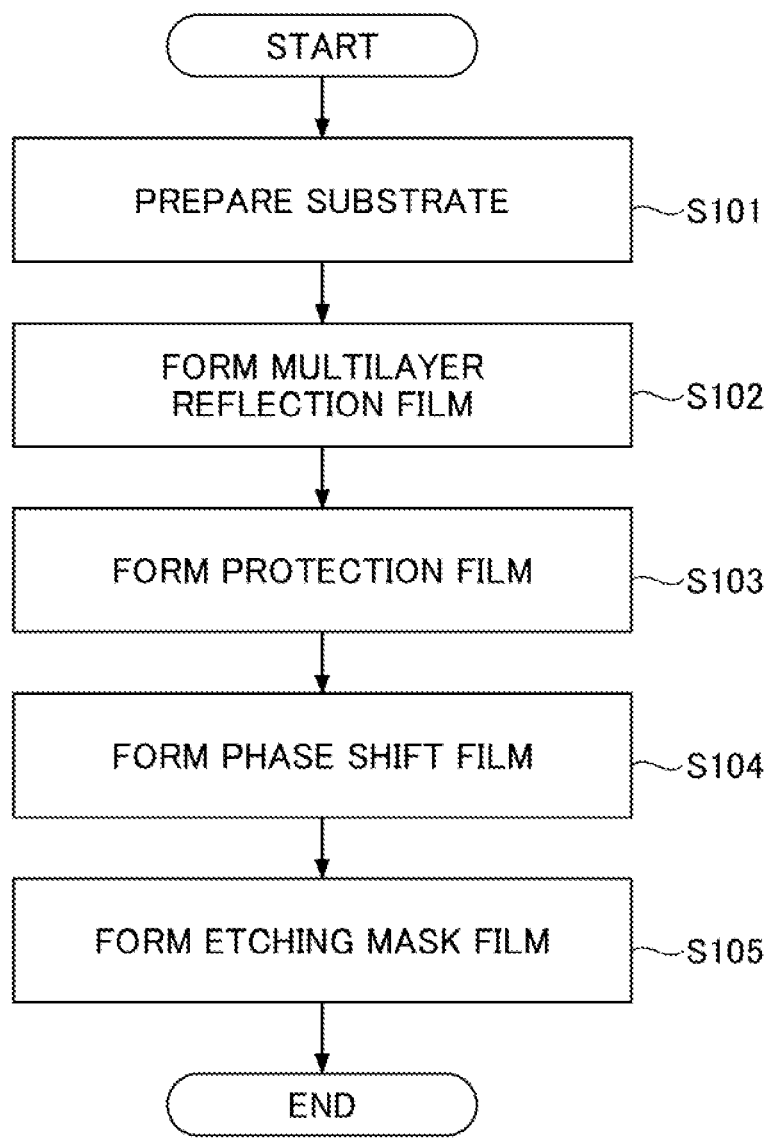

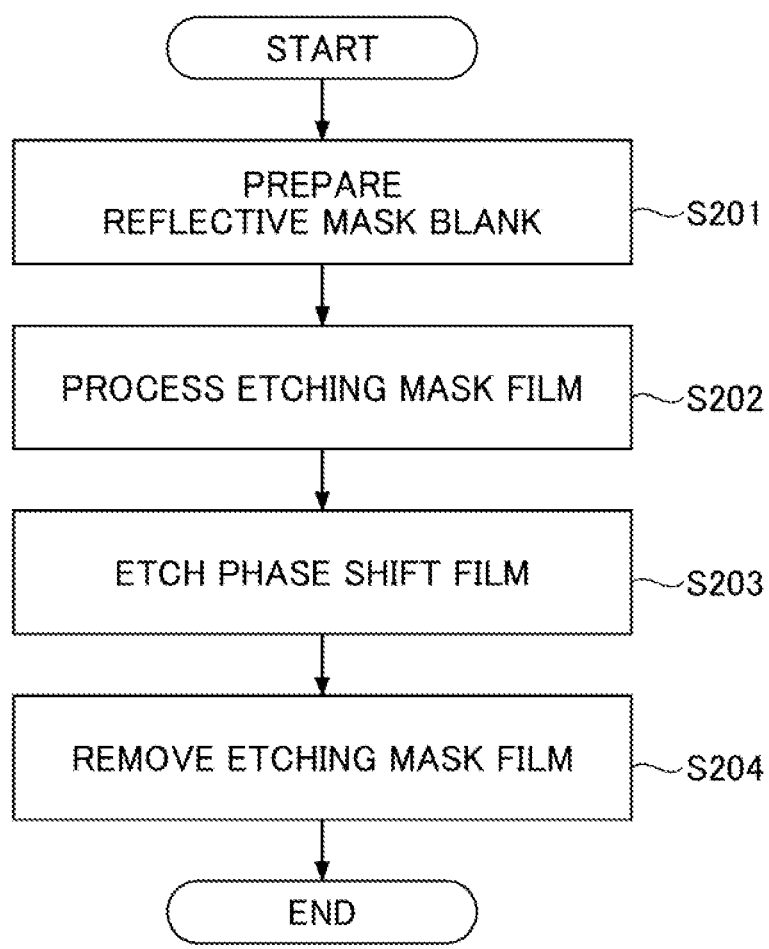

REFLECTIVE MASK BLANK, REFLECTIVE MASK, METHOD OF MANUFACTURING REFLECTIVE MASK BLANK, AND METHOD OF MANUFACTURING REFLECTIVE MASK

CROSS-REFERENCE TO RELATED APPLICATION

The present application is a continuation of U.S. application Ser. No. 18/346,563, filed Jul. 3, 2023, which is a continuation application of International Application No. PCT/JP2022/044842, filed Dec. 6, 2022, which claims priority to Japanese Patent Applications No. 2021-201671 filed Dec. 13, 2021 and No. 2022-108641 filed Jul. 5, 2022. The contents of these applications are incorporated herein by reference in their entirety.

BACKGROUND OF THE INVENTION

1. Field of the Invention

The disclosure herein generally relates to a reflective mask blank, a reflective mask, a method of manufacturing a reflective mask blank, and a method of manufacturing a reflective mask.

2. Description of the Related Art

Along with the recent miniaturization of semiconductor devices, EUV lithography (EUVL), an exposure technology using Extreme Ultra-Violet (EUV) light, has been developed. The EUV light includes a soft X-ray and a vacuum ultraviolet light, and specifically has a wavelength of 0.2 nm-100 nm. At present, EUV light with a wavelength of about 13.5 nm is mainly studied.

In the EUVL, a reflective mask is used. The reflective mask includes a substrate, such as a glass substrate, a multilayer reflective film that reflects EUV light, and a phase shift film that shifts a phase of the EUV light, in this order. An opening pattern is formed in the phase shift film. In the EUVL, the opening pattern of the phase shift film is transferred to a target substrate, such as a semiconductor substrate. The transferring includes transferring a reduced opening pattern.

In EUVL, the so-called shadowing effect occurs. The shadowing effect refers to an occurrence of misalignment or dimensional displacement of a transferred image, caused by an occurrence of an area in the opening pattern near a side wall, in which EUV light is shielded by the side wall, due to an incident angle θ of the EUV light that is not zero degrees (e.g., 6 degrees). To reduce the shadowing effect, it is effective to lower a height of the side wall of the opening pattern, and to make the phase shift film thin.

Ruthenium (Ru) has been investigated as a material for the phase shift film to make the film thin. Since ruthenium has a low refractive index, the phase shift film can be made thin while ensuring a phase difference. However, there is a problem that ruthenium, when used alone, is easily crystallized. The larger the size of the crystal, the greater a roughness of the sidewall of the opening pattern. This is because an etching is liable to proceed along a grain boundary of crystals when the opening pattern is formed.

The phase shift film disclosed in Japanese Patent No. 6929983 contains at least ruthenium, nitrogen, and oxygen. Japanese Patent No. 6929983 discloses that by adding nitrogen and oxygen to ruthenium, a crystallite size (i.e., the size of crystal) can be reduced and a roughness of a sidewall of an opening pattern can be reduced.

SUMMARY OF THE INVENTION

Problem to be Solved by the Invention

Inside an EUV exposure apparatus, a reflective mask may be exposed to hydrogen gas. Hydrogen gas is used, for example, to reduce carbon contamination.

Conventionally, non-metallic elements contained in a phase shift film of the reflective mask are sometimes desorbed from the phase shift film due to the exposure of the phase shift film to hydrogen gas.

An aspect of the present disclosure provides a technique for suppressing a crystallization of a phase shift film and improving hydrogen resistance of the phase shift film.

Means for Solving the Problem

According to an aspect of the present disclosure, a reflective mask blank includes a substrate; a multilayer reflective film that reflects EUV light; a protection film that protects the multilayer reflective film; and a phase shift film that shifts a phase of the EUV light. The substrate, the multilayer reflective film, the protection film, and the phase shift film are arranged in this order. The phase shift film contains at least one first element X1 selected from the first group consisting of ruthenium (Ru), iridium (Ir), platinum (Pt), palladium (Pd), and gold (Au), and at least one second element X2 selected from the second group consisting of oxygen (O), boron (B), carbon (C), and nitrogen (N). In the phase shift film, a chemical shift of a peak of $3d_{5/2}$ or a peak of $4f_{7/2}$ of the first element X1 observed by X-ray electron spectroscopy is less than 0.3 eV.

Effect of the Invention

According to an aspect of the present disclosure, by containing the first element X1 and the second element X2 in the phase shift film, the crystallization of the phase shift film can be suppressed. In addition, according to the chemical shift of the first element X1 being less than 0.3 ev, the desorption of the second element X2 can be suppressed, and the hydrogen resistance of the phase shift film can be improved.

BRIEF DESCRIPTION OF THE DRAWINGS

Other objects and further features of the present disclosure will be apparent from the following detailed description when read in conjunction with the accompanying drawings, in which:

FIG. 8 is a flowchart showing a method of manufacturing a reflective mask blank according to the embodiment; and FIG. 9 is a flowchart showing a method of manufacturing a reflective mask according to the embodiment.

DESCRIPTION OF THE EMBODIMENT

Figure 1:
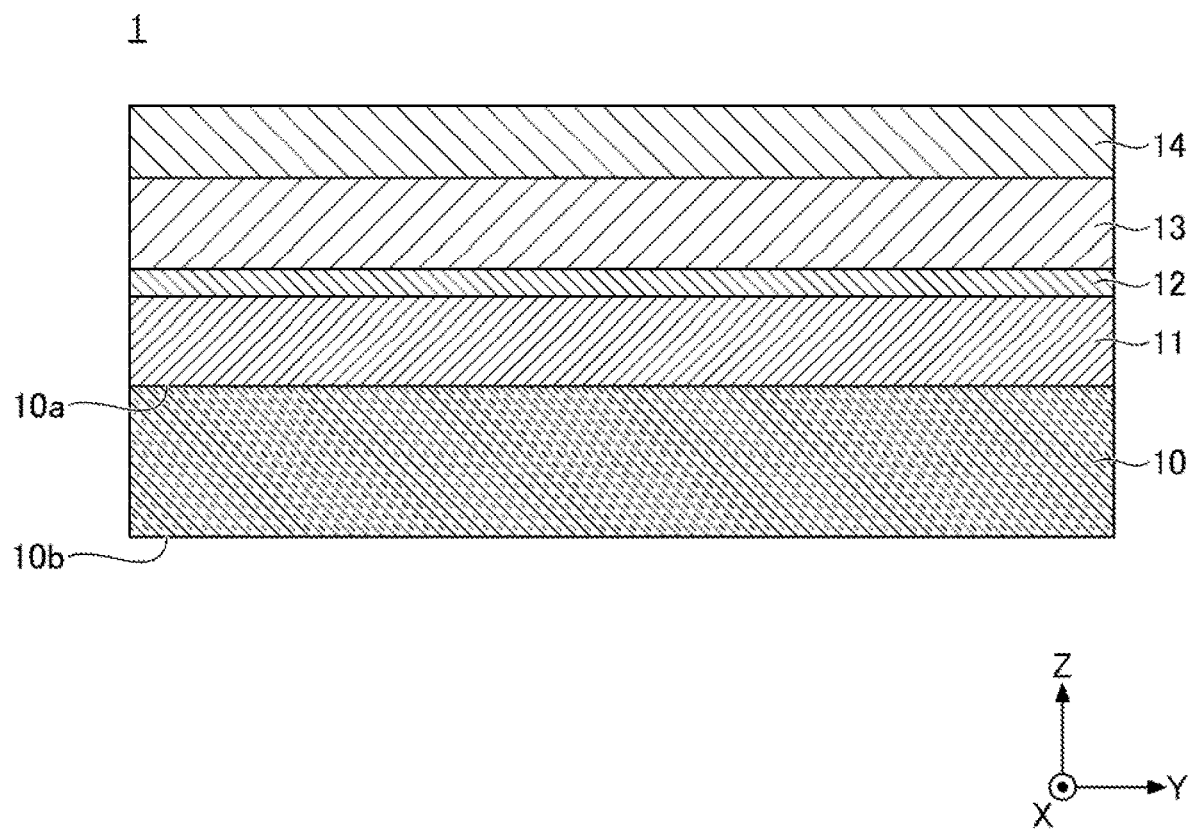
FIG. 1 is a cross-sectional view showing a reflective mask blank according to an embodiment.

In the following, embodiments of the present disclosure will be described with reference to the accompanying drawings. In each drawing, to the same or corresponding configurations, the same reference numeral will be assigned, and an explanation may be omitted. In the specification, a symbol "-" representing a numerical range indicates that values before and after the symbol are included as a lower limit value and an upper limit value, respectively.

Figure 2:
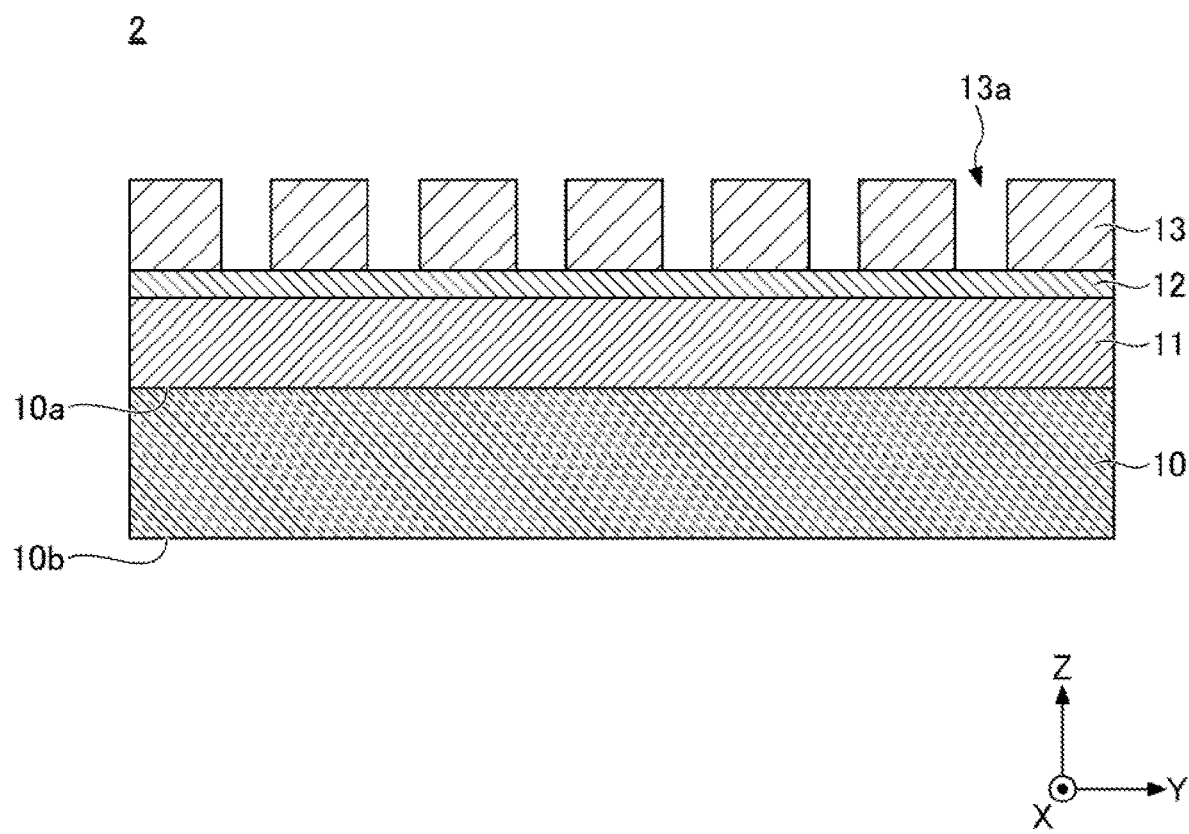
FIG. 2 is a cross-sectional view showing a reflective mask according to the embodiment.
Figure 3:
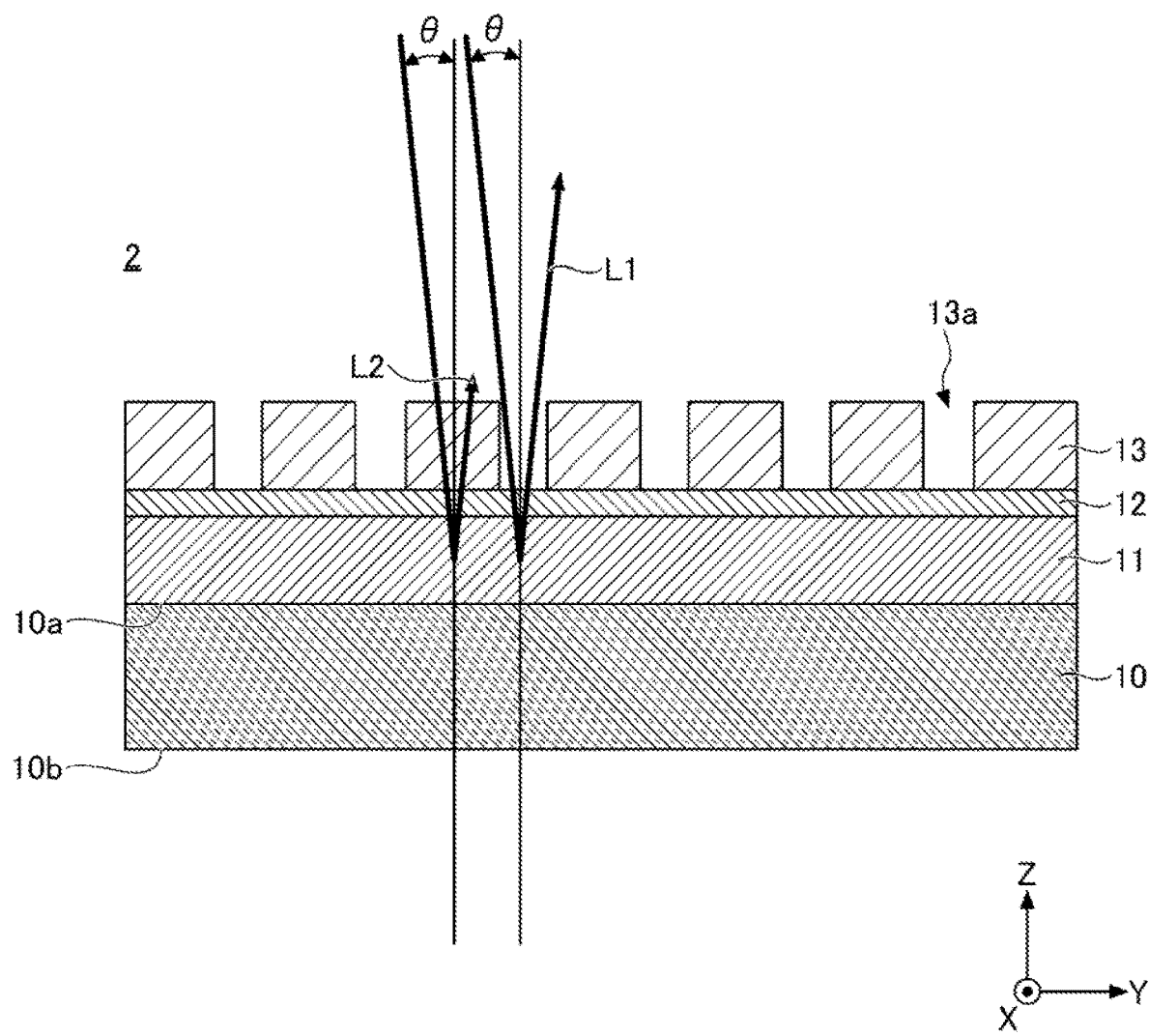
FIG. 3 is a cross-sectional view of the reflective mask for illustrating an example of EUV light reflected by the reflective mask of FIG. 2.

In FIGS. 1 to 3, an X-axis direction, a Y-axis direction, and a Z-axis direction are directions orthogonal to each other. The Z-axis direction is a direction perpendicular to a first main surface 10a of a substrate 10. The X-axis direction is a direction perpendicular to an incident plane of EUV light (a plane including an incident light beam and a reflected light beam). As shown in FIG. 3, the incident light beam is inclined towards the Y-axis positive direction on propagating in the Z-axis negative direction, and the reflected light beam is inclined towards the Y-axis positive direction on propagating in the Z-axis positive direction.

A reflective mask blank 1 according to an embodiment will be described with reference to FIG. 1. The reflective mask blank 1 includes, for example, the substrate 10; a multilayer reflective film 11; a protection film 12; a phase shift film 13; and an etching mask film 14, in this order. The multilayer reflective film 11, the protection film 12, the phase shift film 13, and the etching mask film 14 are formed in this order on the first main surface 10a of the substrate 10. The reflective mask blank 1 only needs to have at least the substrate 10, the multilayer reflective film 11, the protection film 12, and the phase shift film 13.

The reflective mask blank 1 may further have a functional film, which is not shown in FIG. 1. For example, the reflective mask blank 1 may have a conductive film on the side opposite to the multilayer reflective film 11 with respect to the substrate 10. The conductive film is formed on a second main surface 10b of the substrate 10. The second main surface is a surface opposite to the first main surface 10a. The conductive film may be used, for example, to attract a reflective mask 2 to an electrostatic chuck of an exposure apparatus. The reflective mask blank 1 may have a diffusion barrier film (not shown) between the multilayer reflective film 11 and the protection film 12. The diffusion barrier film prevents metal elements contained in the protection film 12 from diffusing into the multilayer reflective film 11.

Although not shown, the reflective mask blank 1 may have a buffer film between the protection film 12 and the phase shift film 13. The buffer film protects the protection film 12 from an etching gas for forming an opening pattern 13a in the phase shift film 13. The buffer film is etched more moderately than the phase shift film 13. Different from the protection film 12, the buffer film ultimately has the same opening pattern as the opening pattern 13a of the phase shift film 13.

Next, the reflective mask 2 according to the embodiment will be described with reference to FIGS. 2 and 3. The reflective mask 2 is manufactured using, for example, the reflective mask blank 1 shown in FIG. 1, and includes the opening pattern 13a in the phase shift film 13. The etching mask film 14 shown in FIG. 1 is removed after the opening pattern 13a is formed in the phase shift film 13.

In BUVL, the opening pattern 13a of the phase shift film 13 is transferred to a target substrate, such as a semiconductor substrate. The transferring includes transferring a reduced opening pattern. In the following, the substrate 10, the multilayer reflective film 11, the protection film 12, the phase shift film 13, and the etching mask film 14 will be described in this order.

The substrate 10 is, for example, a glass substrate. A material of the substrate 10 is preferably quartz glass containing $TiO_2$. Compared with general soda lime glass, a linear expansion coefficient of the quartz glass is small, and thereby a dimensional change due to a temperature change is small. The quartz glass may contain 80 mass %-95 mass % of $SiO_2$ and 4 mass %-17 mass % of $TiO_2$. When the $TiO_2$ content is 4 mass %-17 mass %, the linear expansion coefficient around room temperature is substantially zero, and almost no dimensional change around room temperature occurs. The quartz glass may contain a third component or impurity other than $SiO_2$ and $TiO_2$. The material of the substrate 10 may be crystallized glass in which a β-quartz solid solution is precipitated, silicon, metal, or the like.

The substrate 10 has the first main surface 10a and a second main surface 10b opposite to the first main surface 10a. The multilayer reflective film 11 and the like are formed on the first main surface 10a. The size of the substrate 10 in a plan view (viewed in the Z-axis direction) is, for example, 152 mm longitudinally and 152 mm laterally. The longitudinal and lateral dimensions may be greater than or equal to 152 mm. Each of the first main surface 10a and the second main surface 10b has, for example, a square-shaped quality-guaranteed region at the center thereof. The size of the quality-guaranteed region is, for example, 142 mm longitudinally and 142 mm laterally. The quality-guaranteed region on the first main surface 10a preferably has a root mean square roughness (Rq) of 0.15 nm or less and a flatness of 100 nm or less. The quality-guaranteed region of the first main surface 10a is preferably free from a defect that may cause a phase defect.

The multilayer reflective film 11 reflects EUV light. The multilayer reflective film 11 is formed by alternately stacking, for example, a high refractive index layer and a low refractive index layer. A material of the high refractive index layer is, for example, silicon (Si), and a material of the low refractive index layer is, for example, molybdenum (Mo). With this combination, the multilayer reflective film is a Mo/Si multilayer reflective film. In addition, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, a Si/Ru/Mo/Ru multilayer reflective film, or the like can also be used as the multilayer reflective film 11.

The film thickness of each layer constituting the multilayer reflective film 11 and the number of repeating units of layers can be appropriately selected according to the material of each layer and a reflectance to EUV light. When the multilayer reflective film 11 is a Mo/Si multilayer reflective film, in order to achieve a reflectance of 60% or more with respect to EUV light having an incident angle θ (see FIG. 3) of 6°, a Mo layer having a film thickness of 2.3±0.1 nm and a Si layer having a film thickness of 4.5±0.1 nm may be stacked so that the number of repeating units is 30 or more and 60 or less. The multilayer reflective film 11 preferably has the reflectance of 60% or more to EUV light at an incident angle θ of 6°. The reflectance is more preferably 65% or more.

The method of forming each layer constituting the multilayer reflective film 11 is, for example, a DC sputtering method, a magnetron sputtering method, or an ion beam sputtering method. For example, film formation conditions for each of the Mo layer and the Si layer, when a Mo/Si multilayer reflective film is formed by the ion beam sputtering method, will be shown as follows.

Film Formation Condition for Si Layer

Target: Si;
Sputtering gas: Ar;
Gas pressure: $1.3 \times 10^{-2}$ Pa-$2.7 \times 10^{-2}$ Pa;
Ion acceleration voltage: 300 V-1500 V;
Film formation rate: 0.030 nm/sec-0.300 nm/sec; and
Film thickness of Si layer: 4.5±0.1 nm.

Film Cormation Condition for Mo Layer

Target: Mo;
Sputtering gas: Ar;
Gas pressure: $1.3 \times 10^{-2}$ Pa-$2.7 \times 10^{-2}$ Pa;
Ion acceleration voltage: 300 V-1500 V;
Film formation rate: 0.030 nm/sec-0.300 nm/sec; and
Film thickness of Mo layer: 2.3±0.1 nm Repeating Unit of Si Layer and Mo Layer Number of repeating units: 30-60 (preferably 40-50).

The protection film 12 is formed between the multilayer reflective film 11 and the phase shift film 13, to protect the multilayer reflective film 11. The protection film 12 protects the multilayer reflective film 11 from an etching gas used for forming the opening pattern 13a (see FIG. 2) in the phase shift film 13. The etching gas is, for example, a halogen-based gas, an oxygen-based gas, or a mixture gas thereof. The halogen-based gas includes a chlorine-based gas and a fluorine-based gas. The chlorine-based gas is, for example, a $Cl_2$ gas, a $SiCl_4$ gas, a $CHCl_3$ gas, a $CCl_4$ gas, a $BCl_3$ gas, or a mixture gas thereof. The fluorine-based gas is, for example, a $CF_4$ gas, a $CHF_3$ gas, a $SF_6$ gas, a $BF_3$ gas, a $XeF_2$ gas or a mixture gas thereof. The oxygen-based gas is an $O_2$ gas, an $O_3$ gas or a mixture gas thereof.

A ratio (ER2/ER1) of an etching rate ER1 of etching the phase shift film 13 by the etching gas to an etching rate ER2 of etching the protection film 12 by the etching gas (ER1/ER2) is also referred to as a first selection ratio. The higher the first selection ratio is, the better the processability of the phase shift film 13 is. The first selection ratio is preferably 10 or more, and more preferably 30 or more. The first selection ratio is preferably 200 or less, and more preferably 100 or less.

The protection film 12 contains at least one element selected from, for example, ruthenium (Ru), rhodium (Rh), and silicon (Si). When the protection film 12 contains Rh, the protection film may contain only Rh, but the protection film may contain, in addition to Rh, at least one element Z1 selected from the group consisting of Ru, Nb, Mo, Ta, Ix, Pd, Zx, Y, and Ti.

When the element Z1 is Ru, Nb, Mo, Zr, Y, ox Ti, an extinction coefficient k of the protection film 12 can be reduced while suppressing an increase of the refractive index n of the protection film, so that the reflectance for EUV light can be improved. When the element Z1 is Ru, Ta, Ir, Pd, or Y, resistance to the etching gas or/and resistance to a sulfuric acid-hydrogen peroxide mixture can be improved. A sulfuric acid-hydrogen peroxide mixture is used for removing a resist film, which will be described later, or cleaning the reflective mask 2.

An element ratio between the element Z1 (all Z1) and rhodium (Rh), Z1:Rh, is preferably 1:99-1:1. In the specification of the present application, the element ratio means a molar ratio. When the value of the ratio Z1/Rh is 1/99 or more, the reflectance for EUV light is excellent. When the value of the ratio Z1/Rh is less than or equal to 1, the resistance of the protection film 12 to the etching gas is excellent. The element ratio between Z1 and Rh, Z1:Rh, is more preferably 3:10-1:1.

The protection film 12 may contain, in addition to rhodium (Rh), at least one element Z2 selected from the group consisting of nitrogen (N), oxygen (O), carbon (C), and boron (B). Although the element Z2 reduces the resistance of the protection film 12 to the etching gas, the element Z2 improves the smoothness of the protection film 12 according to reduction of crystallinity of the protection film 12. The protection film 12 containing the element Z2 has a non-crystalline structure or a microcrystalline structure. When the protection film 12 has a non-crystalline structure or a microcrystalline structure, the X-ray diffraction (XRD) profile of the protection film 12 does not exhibit a clear peak.

When the protection film 12 contains Z2 in addition to Rh, it is preferable that the content of Rh or the total content of Rh and 21 is 40 at %-99 at %, and the total content of 22 is 1 at %-60 at %. When the protection film 12 contains Z2 in addition to Rh, it is more preferable that the content of Rh or the total content of Rh and Z1 is 80 at %-99 at %, and the total content of Z2 is 1 at %-20 at %.

When the protection film 12 contains 90 at % or more of Rh, contains Z1, Z2, or both, and has a film density of 10.0 g/cm³-14.0 g/cm³, the protection film 12 has a non-crystalline structure or a microcrystalline structure. The film density of the protection film 12 is preferably 11.0 g/cm³-13.0 g/cm³. When the protection film 12 contains 100 at % of Rh and has the film density of 11.0 g/cm³-12.0 g/cm³, the protection film 12 has a non-crystalline structure or a microcrystalline structure. The film density of the protection film 12 is measured using an X-ray reflectance method.

The film thickness of the protection film 12 is preferably 1.0 nm or more and 10.0 nm or less, and more preferably 2.0 nm or more and 3.5 nm or less.

The root mean square roughness (Rq) of the protection film 12 is preferably 0.3 nm or less, and more preferably 0.1 nm or less.

The method of forming the protection film 12 includes, for example, a DC sputtering method, a magnetron sputtering method, or an ion beam sputtering method. For example, film formation conditions, when a Rh film is formed by the DC sputtering method, will be shown as follows.

Film Formation Conditions for Rh Film

Target: Rh;
Sputtering gas: Ar;
Gas pressure: $1.0 \times 10^{-2}$ Pa-$1.0 \times 10^{0}$ Pa;
Power density of target: 1.0 W/cm²-8.5 W/cm²;
Film formation rate: 0.020 nm/sec-1.000 nm/sec; and
Film thickness of Rh film: 1 nm-10 nm.

When the Rh film is formed, a $N_2$ gas or a mixture gas of an Ar gas and a $N_2$ gas may be used as the sputtering gas. The volume ratio of a $Na_2$ gas in the sputtering gas, $N_2$/(Ar+$N_2$), is 0.05 or more and 1.0 or less.

For example, film formation conditions, when a RhO film is formed by the DC sputtering method, will be shown as follows.

Film Formation Conditions for RhO Film

Target: Rh;
Sputtering gas: an $O_2$ gas, or a mixture gas of an Ar gas and an $O_2$ gas;
Volume ratio of an $O_2$ gas in sputtering gas ($O_2/(Ar+O_2)$): 0.05-1.0;
Gas pressure: $1.0 \times 10^{-2}$ Pa-$1.0 \times 10^0$ Pa;
Power density of target: 1.0 W/cm$^2$-8.5 W/cm$^2$;
Film formation rate: 0.020 mm/sec-1.000 nm/sec; and
Film thickness of RhO film: 1 nm-10 nm.

For example, film formation conditions, when a RhRu film is formed by the DC sputtering method, will be shown as follows.

Film Formation Conditions for RhRu Film

Target: Rh and Ru (or RhRu);
Sputtering gas: Ar;
Gas pressure: $1.0 \times 10^{-2}$ Pa-$1.0 \times 10^0$ Pa;
Power density of target: 1.0 W/cm$^2$-8.5 W/cm$^2$;
Film formation rate: 0.020 nm/sec-1.000 nm/sec; and
Film thickness of RhRu film: 1 nm-10 nm.

The phase shift film 13 is a film in which the opening pattern 13a is to be formed. The opening pattern 13a is not formed in the manufacturing process of the reflective mask blank 1 but is formed in the manufacturing process of the reflective mask 2. The phase shift film 13 shifts a phase of second EUV light L2 with respect to a phase of first EUV light L1 shown in FIG. 3.

The first EUV light L1 is light that entered and passed through the opening pattern 13a without passing through the phase shift film 13, was reflected by the multilayer reflective film 11, and passed through the opening pattern 13a again without passing through the phase shift film 13 and exited. The second EUV light L2 is light that entered and passed through the phase shift film 13 while being absorbed by the phase shift film 13, was reflected by the multilayer reflective film 11, and passed through the phase shift film 13 while being absorbed again by the phase shift film 13 and exited.

The phase difference, which is greater than or equal to zero, between the first EUV light L1 and the second EUV light L2 is, for example, 170°-250°. A phase of the first EUV light L1 may be advanced or retarded from a phase of the second EUV light L2. The phase shift film 13 improves a contrast of a transferred image by utilizing an interference between the first EUV light 11 and the second EUV light L2. The transferred image is an image obtained by transferring the opening pattern 13a of the phase shift film 13 to a target substrate.

In EUVL, the so-called shadowing effect occurs. The shadowing effect is caused by an incident angle θ of EDV light that is not 0° (e.g.) 6°, which causes a region near the side wall of the opening pattern 13a that blocks the EUV light by the side wall, resulting in a positional displacement or dimensional displacement of the transferred image. To reduce the shadowing effect, lowering the height of the side wall of the opening pattern 13a is effective, and thinning the phase shift film 13 is effective.

A film thickness of the phase shift film 13 is, for example, 60 nm or less, and preferably 50 nm or less, to reduce the shadowing effect. The film thickness of the phase shift film 13 is preferably 20 nm or more, and more preferably 30 nm or more, to ensure the phase difference between the first EUV light L1 and the second EUV light L2.

To reduce the film thickness of the phase shift film 13 to reduce the shadowing effect while ensuring the phase difference between the first EUV light L1 and the second EUV light L2, it is effective to reduce a refractive index of the phase shift film 13.

Figure 4:
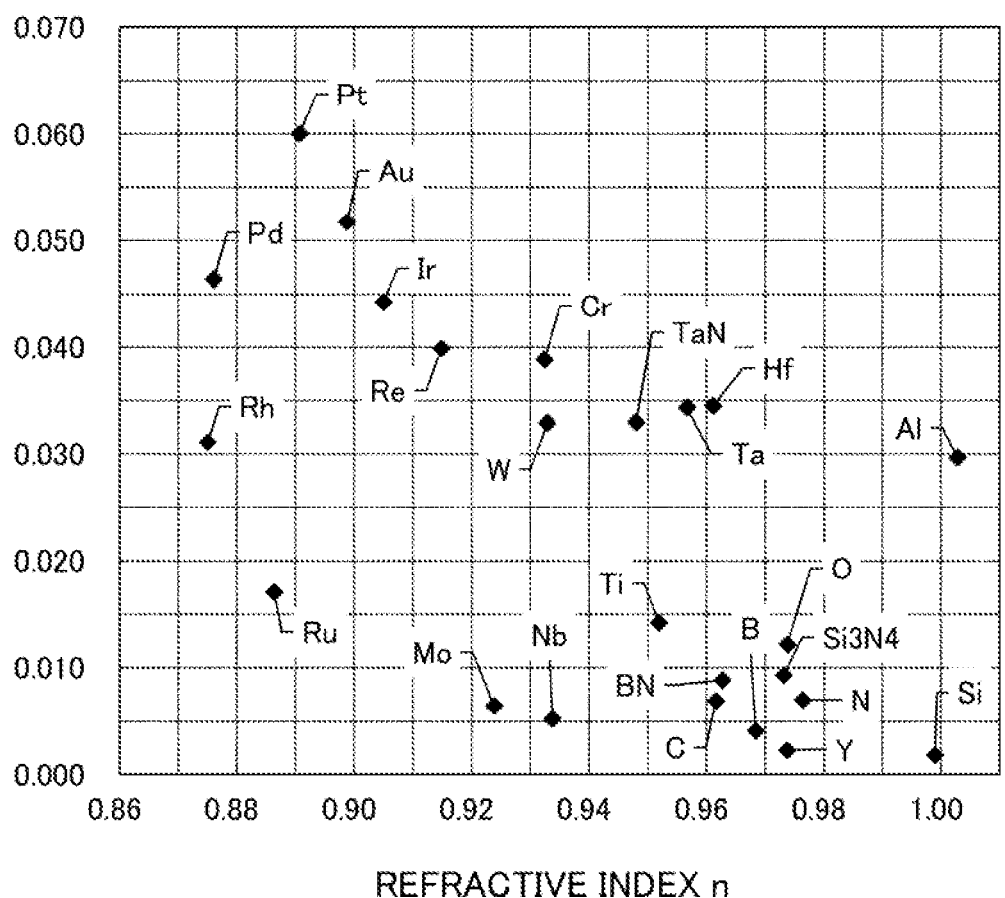
FIG. 4 is a diagram showing an example of relationships between refractive indices and extinction coefficients of elements and compounds.

The phase shift film 13 contains at least one first element X1 selected from the first group consisting of Ru, Ir, Pt, Pd, and Au. The first element X1 is a precious metal element. Since the first element X1 has a small refractive index, as is clear from FIG. 4, the phase shift film 13 can be thinned while ensuring the phase difference. A phase shift film underlayer may be further provided between the phase shift film 13 and the protection film 12. The phase shift film underlayer is a layer formed in contact with the uppermost surface of the protection film 12. By forming a two-layer structure of the phase shift film 13 and the phase shift film underlayer, the phase difference between the first EUV light L1 and the second EUV light L2 can be adjusted. From the viewpoint of processing characteristics, it is preferable that the phase shift film underlayer mainly contains Ta and the phase shift film 13 contains Ru.

There is a problem that the first element X1 is easily crystallized when used alone. The larger the size of the crystal, the greater the roughness of the sidewall of the opening pattern 13a. This is because during the formation of the opening pattern 13a, the etching easily proceeds along a grain boundary.

In addition to the first element X1, the phase shift film 13 contains at least one second element X2 selected from the second group consisting of O, B, C, and N. The second element X2 is a non-metallic element. By adding the second element X2 to the first element X1, crystallization of the phase shift film 13 can be suppressed, and the roughness of the sidewall of the opening pattern 13a can be reduced. The second element X2 preferably contains oxygen, more preferably oxygen and nitrogen. The phase shift film 13 preferably contains at least one second element X2 selected from the second group consisting of O, B, and C in addition to the first element X1. The phase shift film 13 more preferably contains 1 at % or more and 55 at % or less of O.

The phase shift film 13 has a chemical shift ΔE1 of less than 0.3 eV for the peak of $3d_{5/2}$ or $4f_{7/2}$ of the first element X1 observed by X-ray Photoelectron Spectroscopy (XPS). The peak of $3d_{5/2}$ or $4f_{7/2}$ of the first element X1 is the peak of $3d_{5/2}$ of Ru or Pd or the peak of $4f_{7/2}$ of Ir, Pt, or Au.

The binding energy of an electron observed by X-ray electron spectroscopy represents a magnitude of an energy consumed when the electron is emitted. When the first element X1 is bound to a nonmetallic element, the first element X1 is positively charged. Thus, a large amount of energy is consumed for the electron to be emitted from the first element X1. Therefore, when the first element X1 is bound to a nonmetallic element, the peak binding energy is higher than that when the first element X1 exists alone.

The chemical shift, ΔE1, of the peak of the first element X1 observed by X-ray electron spectroscopy is a magnitude (absolute value) of a difference between an actually observed binding energy of the peak of the first element X1 and a binding energy of the peak of the first element X1 when the first element X1 exists alone without being bound to a nonmetallic element (reference binding energy). The binding energy of the actually observed peak of the first element X1 is basically higher than the reference binding energy. The reference binding energy for each element is from the literature values described in HANDBOOK OF X-RAY PHOTOELECTRON SPECTROSCOPY (1979), (edited by C. D. Wagner, W. M. Riggs, L. E. Davis, J. F. Moulder, and G. E. Muilenberg), etc.

If the chemical shift $\Delta E1$ of the peak of the first element X1 observed by X-ray electron spectroscopy is less than 0.3 eV, the first element X1 and the second element X2 contained in the phase shift film 13 are not appreciably bonded. If the first element X1 and the second element X2 are not bonded, a bond is not broken by hydrogen gas and a hydride of the second element X2 is not formed. When the hydride of the second element X2 is formed, the second element X2 desorbs from the phase shift film 13 because the hydride is highly volatile. The chemical shift $\Delta E1$ is preferably less than 0.3 eV, more preferably less than 0.2 eV, and more preferably less than 0.1 eV.

The chemical shift $\Delta E1$ of the peak of the first element X1 can be adjusted, for example, by a multicomponent sputtering method using a target containing the first element X1, a target containing the second element X2, and a target containing the third element X3, or by a reactive sputtering method using a target containing the first element X1 and a target containing the third element X3. The third element X3 contained in the phase shift film 13 is selectively bonded to the second element X2 by a multicomponent sputtering method or reactive sputtering method, so that breaking of the bonding between the first element X1 and the second element X2 by hydrogen gas is suppressed, and hydride formation of the second element X2 can be suppressed. Therefore, the chemical shift $\Delta E1$ of the peak of the first element X1 can be adjusted to less than 0.3 eV. The method of supplying the second element X2 is not particularly limited, but the second element X2 is preferably supplied from a gas or a target, and more preferably supplied as a gas. Oxygen, nitrogen, and methane are preferably used as the gas. When the element X2 is supplied as a gas, in the multicomponent sputtering method using a target containing the element X1 and a target containing the element X3, the gas of the element X2 is preferably supplied from the vicinity of the target containing the element X3. Then, the chemical shift $\Delta E3$ of the peak of the third element X3 can be made greater than the chemical shift $\Delta E1$ of the peak of the first element X1.

Moreover, the chemical shift $\Delta E1$ of the peak of the first element X1 can also be adjusted by a multicomponent sputtering method of a target containing the first element X1 and a compound target containing the second element X2 and the third element X3. By using the compound target containing the second element X2 and the third element X3, bonding between the first element X1 and the second element X2 is suppressed, and breaking of bonds by hydrogen gas is also suppressed, so that formation of a hydride of the second element X2 can be suppressed. Therefore, the chemical shift $\Delta E1$ of the peak of the first element X1 can be adjusted to less than 0.3 eV.

Conventionally, when the phase shift film 13 contains Ru as the first element X1 and O as the second element X2, that is, when the phase shift film 13 is a RuO film, Ru and O are coupled. The bond between Ru and O is broken by hydrogen gas to produce $H_2O$. As a result, the RuO film was sometimes reduced to a Ru film. When the RuO film was reduced to a Ru film, a film thickness after the reduction was smaller than that before the reduction, and the phase difference between the first EUV light L1 and the second EUV light 12 could not be ensured.

In the present invention, analysis of the phase shift film by XPS is carried out by the following procedure. The analysis by XPS is performed using an analyzing apparatus "PHI 5000 VersaProbe" manufactured by ULVAC-PHI, Inc. The above apparatus is calibrated in accordance with JIS K0145.

First, a measuring sample of about a square of 1 cm per side is obtained by cutting out from a reflective mask blank. The obtained measuring sample is set in a measuring holder so that the phase shift film serves as a measuring surface.

After the measuring holder is carried into the apparatus, a part of the phase shift film is removed by an argon ion beam until a peak observed from the outermost surface becomes constant.

After the surface of the phase shift film is removed, the part where the surface is removed is irradiated with X-rays (monochromatized Alk$\alpha$ rays), and a photoelectron extraction angle (an angle formed by the surface of the measuring sample and a direction of the detector) is set to 45° to perform the analysis. During the analysis, a flood gun is used to suppress charge-up.

In the analysis, a wide scan is performed in the range of binding energies 0 eV-1000 eV to identify elements present, followed by a narrow scan depending on the elements present. The narrow scan is performed with, for example, a path energy of 58.7 eV, an energy step of 0.1 eV, a time/step of 50 ms, and an integration number of 5 times. The wide scan is performed with a path energy of 58.7 eV, an energy step of 1 eV, a time/step of 50 ms, and an integration number of 2 times.

Here, for the calibration of binding energy, the peak of the C1s orbit derived from carbon present on the measured sample is used. Specifically, first, the binding energy value indicating the peak of the C1s orbit in the measured sample is obtained from the analysis result of the narrow scan, and a value obtained by subtracting the binding energy value from 284.8 eV serves as the shift value. The above shift value is added to a binding energy value indicating a peak of each orbit obtained from the analysis result of the narrow scan, and a binding energy value of the peak corresponding to each orbit defined above is calculated. The binding energy may be calibrated using Au whose surface is cleaned in an ultra-high vacuum. In this case, the shift value is a value obtained by subtracting a binding energy value of the $Au4f_{7/2}$ orbit from 83.96 eV from the analysis result of the narrow scan.

When the binding energy value indicating the peak of each orbit is read from the analysis result of the narrow scan described as above, a value indicating a peak top is read as the binding energy value.

According to the present embodiment, the first element X1 and the second element X2 contained in the phase shift film 13 are not appreciably bonded, and bonds are not broken by hydrogen gas. Therefore, a hydride of the second element X2 is not generated, and the second element X2 is not desorbed from the phase shift film 13. Therefore, the hydrogen resistance of the phase shift film 13 can be improved, and a change in the film thickness of the phase shift film 13 can be suppressed.

The phase shift film 13 preferably contains a third element X3 whose standard Gibbs energy of formation of at least one of oxide, boride, carbide, and nitride is less than or equal to −130 kJ/mol. That is, the phase shift film 13 preferably contains a compound of X1, X2 and X3. The standard Gibbs energy of formation is a free energy required to synthesize a material from a single element with respect to a ground state that is a state in which the element stably exists in the standard state (25° C. and 1 atm). The lower the standard Gibbs energy of formation, the more stable the material.

When the standard Gibbs energy of formation of oxides, borides, carbides, or nitrides, which are compounds of the third element X3 and the second element X2, is less than −130 KJ/mol, the stability of the compound is sufficiently high. The third element X3 and the second element X2 are strongly bonded and the bonds are not broken by hydrogen gas. Therefore, the formation of hydride of the second element X2 can be suppressed and the desorption of the second element X2 from the phase shift film 13 can be suppressed. Therefore, the hydrogen resistance of the phase shift film 13 can be improved. The above standard Gibbs energy of formation is more preferably −500 kJ/mol or less.

The third element X3 is at least one selected from the third group consisting of, for example, tantalum (Ta), niobium (Nb), molybdenum (Mo), chromium (Cr), silicon (Si), hafnium (Hf), tungsten (W), and rhenium (Re). According to the third group of elements, the above standard Gibbs energy of formation is less than −500 kJ/mol.

Among the third group of elements, Ta, Nb, and Si can improve the resistance of the phase shift film 13 to sulfuric acid/hydrogen peroxide. Sulfuric acid/hydrogen peroxide is used for removing a resist film, which will be described later, or for cleaning the reflective mask 2. On the other hand, among the elements in the third group, Mo, Cr, Hf, W, and Re have a large first selection ratio, and workability of the phase shift film 13 is good.

In the phase shift film 13, the chemical shift, ΔE3, of the peak of the third element X3 observed by X-ray electron spectroscopy is 0.2 eV or more. The peak of the third element X3 is, for example, a peak of $4f_{7/2}$ of Ta, Hf, W or Re, a peak of $3d_{5/2}$ of Nb or Mo, a peak of $2p_{3/2}$ of Si, or a peak of $2p_{3/2}$ of Cr.

The binding energy of an electron observed by X-ray electron spectroscopy represents a magnitude of an energy consumed when the electron is emitted. When the third element X3 is bound to a nonmetallic element, the third element X3 is positively charged, so a large amount of energy is consumed for the electron to be emitted from the third element X3. Therefore, when the third element X3 is bound to a nonmetallic element, the peak binding energy is higher than that when the third element X3 exists alone.

The chemical shift, ΔE3, of the peak of the third element X3 observed by X-ray electron spectroscopy is a magnitude (absolute value) of a difference between an actually observed binding energy of the peak of the third element X3 and a binding energy of the peak of the third element X3 when the element X3 exists alone without being bound to a nonmetallic element (reference binding energy). The binding energy of the actually observed peak of the third element X3 is basically higher than the reference binding energy.

The chemical shift ΔE3 of the peak of the third element X3 is preferably greater than the chemical shift ΔE1 of the peak of the first element X1. The third element X3 is more strongly bound to the second element X2 than to the first element X1 (the bond between X3 and X2 is stronger than the bond between X1 and X2), and the bond (the bond between X3 and X2) is not broken by hydrogen gas. Therefore, the formation of hydride of the second element X2 can be suppressed, and the desorption of the second element X2 from the phase shift film 13 can be suppressed. Therefore, the hydrogen resistance of the phase shift film 13 can be improved.

The chemical shift, ΔE3, of the peak of the third element X3 observed by X-ray electron spectroscopy is preferably greater than or equal to 0.2 eV, more preferably greater than or equal to 0.3 eV, still more preferably greater than or equal to 0.5 eV, even more preferably greater than or equal to 1.0 eV, especially preferably greater than or equal to 2.0 eV, and still more preferably greater than or equal to 2.5 eV.

The phase shift film 13 contains, but is not particularly limited to, for example, 40 at %-98 at % in total of the first element X1, 1 at %-59 at % in total of the second element X2, and 1 at %-30 at % in total of the third element X3. When the contents of the first element X1, the second element X2, and the third element X3 are within the above ranges, the effect of suppressing crystallization of the phase shift film 13 and the effect of improving the hydrogen resistance of the phase shift film 13 are high.

A total content of the first element X1 is, for example, 40 at %-98 at %. When the total content of the first element X1 is 40 at % or more, the refractive index of the phase shift film 13 is low, and the shadowing effect can be reduced while ensuring the phase difference between the first EUV light L1 and the second EUV light L2. The total content of the first element X1 is preferably 60 at %-98 at %, and more preferably 80 at %-98 at %.

A total content of the second element X2 is, for example, 1 at %-59 at %. When the total content of the second element X2 is 1 at % or more, the crystallization of the phase shift film 13 can be suppressed and the roughness of the sidewall of the opening pattern 13a can be reduced. When the total content of the second element X2 is 59 at % or less, the hydrogen resistance of the phase shift film 13 can be improved. The total content of the second element X2 is preferably 1 at %-59 at %, more preferably 1 at %-30 at %, even more preferably 1 at %-20 at %, and especially preferably 1 at %-15 at %.

The total content of the third element X3 is, for example, 1 at %-30 at %. When the total content of the third element X3 is 1 at % or more, the hydrogen resistance of the phase shift film 13 can be improved. When the total content of the third element X3 is 30 at % or less, the first selection ratio is large and the workability of the phase shift film 13 is good. The total content of the third element X3 is preferably 1 at %-20 at %, and more preferably 2 at %-15 at %.

A ratio (X1/X3) of the total content (at %) of the first element X1 to the total content (at %) of the third element X3 is, for example, 6-97. When the ratio (X1/X3) of the total content of the first element X1 to the total content of the third element X3 is 6 or more, the hydrogen resistance of the phase shift film 13 can be improved. When the ratio (X1/X3) of the total content of the first element X1 to the total content of the third element X3 is 97 or less, the first selection ratio is large and the workability of the phase shift film 13 is good. The ratio (X1/X3) of the total content of the first element X1 to the total content of the third element X3 is preferably 6-96, more preferably 7-96, even more preferably 7-95, and especially preferably 7-60.

When the first element X1 is Ru and the third element X3 is Ta, a ratio of a Ru content (at %) to a Ta content (at %) (Ru/Ta) is, for example, 10-97. When the ratio of the Ru content to the Ta content (Ru/Ta) is 10 or more, the hydrogen resistance of the phase shift film 13 can be improved. When the ratio of the Ru content to the Ta content (Ru/Ta) is 97 or less, the first selection ratio is large and the workability of the phase shift film 13 is good. The ratio of the Ru content to the Ta content (Ru/Ta) is preferably 10-97, more preferably 15-96, even more preferably 18-95.5, and especially preferably 20-50.

When the first element X1 is Ru and the third element X3 is Cr, a ratio of a Ru content (at %) to a Cr content (at %) (Ru/Cr) is, for example, 1-13. When the ratio of the Ru content to the Cr content (Ru/Cr) is 1 or more, the hydrogen resistance of the phase shift film 13 can be improved. When the ratio of the Ru content to the Cr content (Ru/Cr) is 13 or less, the first selection ratio is large and the workability of the phase shift film 13 is good. The ratio of the Ru content to the Cr content (Ru/Cr) is preferably 1-13, more preferably 1-6, even more preferably 1.5-5.7, and especially preferably 1.8-5.6. When the first element X1 is Ru and the third element X3 is Mo, a ratio of a Ru content (at %) to a Mo content (at %) (Ru/Mo) is, for example, 1-20. When the ratio of the Ru content to the Mo content (Ru/Mo) is 1 or more, the hydrogen resistance of the phase shift film 13 can be improved. When the ratio of the Ru content to the Mo content (Ru/Mo) is 20 or less, the first selection ratio is large and the workability of the phase shift film 13 is good. The ratio of the Ru content to the Mo content (Ru/Mo) is preferably 1-20, more preferably 2-18, even more preferably 4-10, and especially preferably 5-8.

When the first element X1 is Ru and the third element X3 is W, a ratio of a Ru content (at %) to a W content (ats) (Ru/W) is, for example, 1-20. When the ratio of the Ru content to the W content (Ru/W) is 1 or more, the hydrogen resistance of the phase shift film 13 can be improved. When the ratio of the Ru content to the W content (Ru/W) is 20 or less, the first selection ratio is large and the workability of the phase shift film 13 is good. The ratio of the Ru content to the W content (Ru/W) is preferably 1-20, more preferably 2-18, even more preferably 2-15, and especially preferably 2-9.

When the first element X1 is Ru and the third element X3 is Hf, a ratio of a Ru content (at %) to a Hf content (at %) (Ru/Hf) is, for example, 1-45. When the ratio of the Ru content to the Hf content (Ru/Hf) is 1 or more, the hydrogen resistance of the phase shift film 13 can be improved. When the ratio of the Ru content to the Hf content (Ru/Hf) is 45 or less, the first selection ratio is large and the workability of the phase shift film 13 is good. The ratio of the Ru content to the Hf content (Ru/Hf) is preferably 1-45, more preferably 2-40, even more preferably 2-10, and especially preferably 3-6.

When the first element X1 is Ir and the third element X3 is Ta, a ratio of an Ir content (at %) to a Ta content (at %) (Ir/Ta) is, for example, 1-40. When the ratio of the Ir content to the Ta content (Ix/Ta) is 1 or more, the hydrogen resistance of the phase shift film 13 can be improved. When the ratio of the Ir content to the Ta content (Ir/Ta) is 40 or less, the first selection ratio is large and the workability of the phase shift film 13 is good. The ratio of the Ir content to the Ta content (Ir/Ta) is preferably 1-40, more preferably 1-35, even more preferably 2-25, especially preferably 2-10, and most preferably 2-6.

When the first element X1 is Ir and the third element X3 is Cr, a ratio of an Ir content (at %) to a Cr content (at %) (Ir/Cr) is, for example, 1-10. When the ratio of the Ir content to the Cr content (Ir/Cr) is 1 or more, the hydrogen resistance of the phase shift film 13 can be improved. When the ratio of the Ir content to the Cr content (Ix/Cr) is 10 or less, the first selection ratio is large and the workability of the phase shift film 13 is good. The ratio of the Ir content to the Cr content (Ir/Cr) is preferably 1-10, more preferably 2-8, and even more preferably 3-6.

When the first element X1 is Pt and the third element X3 is Ta, a ratio of a Pt content (at %) to a Ta content (att) (Pt/Ta) is, for example, 40-90. When the ratio of the Pt content to the Ta content (Pt/Ta) is 40 or more, the hydrogen resistance of the phase shift film 13 can be improved. When the ratio of the Pt content to the Ta content (Pt/Ta) is 90 or less, the first selection ratio is large and the workability of the phase shift film 13 is good. The ratio of the Pt content to the Ta content (Pt/Ta) is preferably 40-90, more preferably 45-88, even more preferably 50-85, and especially preferably 60-82.

When the first element X1 is Ru and the second element X2 is O, a ratio of a Ru content (at %) to an O content (at %) (Ru/O) is, for example, greater than 0.7 and less than or equal to 50. When the ratio of the Ru content to the O content (Ru/O) is greater than 0.7, the crystallization of the phase shift film 13 can be suppressed and the sidewall roughness of the opening pattern 13a can be reduced. When the ratio of the Ru content to the O content (Ru/O) is 50 or less, the hydrogen resistance of the phase shift film 13 can be improved. The ratio of the Ru content to the O content (Ru/O) is preferably greater than 0.7 and less than or equal to 50, more preferably 0.8-40, even more preferably 1-35, especially preferably 2-30, and most preferably 3-25.

When the first element X1 is Ru and the second element X2 is N, a ratio (Ru/N) of a Ru content (at %) to a N content (at %) is, for example, 11-50. When the ratio (Ru/N) of the Ru content to the N content is 11 or more, the crystallization of the phase shift film 13 can be suppressed and the roughness of the sidewall of the opening pattern 13a can be reduced. When the ratio (Ru/M) of the Ru content to the N content is 50 or less, the hydrogen resistance of the phase shift film 13 can be improved. The ratio (Ru/N) of the Ru content to the N content is preferably 11-50, more preferably 11.5-45, even more preferably 12-44, especially preferably 20-43, and most preferably 25-42.

When the first element X1 is Ir and the second element X2 is O, a ratio (Ir/O) of an Ir content (at %) to an O content (at %) is, for example, 1-40. When the ratio (Ir/O) of the Ir content to the O content is 1 or more, the crystallization of the phase shift film 13 can be suppressed and the roughness of the sidewall of the opening pattern 13a can be reduced. When the ratio (Ir/O) of the Ir content to the O content is 40 or less, the hydrogen resistance of the phase shift film 13 can be improved. The ratio (Ir/O) of the Ir content to the O content is preferably 1-40, more preferably 2-35, even more preferably 2-30, especially preferably 2-20, and most preferably 3-15.

When the first element X1 is Ir and the second element X2 is N, a ratio (Ir/N) of an Ir content (at %) to a N content (at %) is, for example, 10-50. When the ratio (Ir/N) of the Ir content to the N content is 10 or more, the crystallization of the phase shift film 13 can be suppressed and the roughness of the sidewall of the opening pattern 13a can be reduced. When the ratio (Ir/N) of the Ir content to the N content is 50 or less, the hydrogen resistance of the phase shift film 13 can be improved. The ratio (Ir/N) of the Ir content to the N content is preferably 10-50, more preferably 10-45, even more preferably 10-40, especially preferably 11-35, and most preferably 12-30.

When the first element X1 is Pt and the second element X2 is O, a ratio of a Pt content (at %) to an O content (at %) (Pt/O) is, for example, 0.5-10. When the ratio of the Pt content to the O content (Pt/O) is 0.5 or more, the crystallization 16 of the phase shift film 13 can be suppressed and the roughness of the sidewall of the opening pattern 13a can be reduced. When the ratio of the Pt content to the O content (Pt/O) is 10 or less, the hydrogen resistance of the phase shift film 13 can be improved. The ratio of the Pt content to the O content (Pt/O) is preferably 0.5-10, more preferably 0.7-8, and even more preferably 1-5.

When the first element X1 is Ru and the second element X2 is O and N, a ratio of a Ru content (at %) to a sum of an O content (ats) and a N content (at %) (Ru/(O+N)) is, for example, greater than 0.8 and less than or equal to 30. When the ratio of the Ru content to the sum of the O content and the N content (Ru/(O+N)) is greater than 0.8, the crystallization of the phase shift film 13 can be suppressed and the roughness of the sidewall of the opening pattern 13a can be reduced. When the ratio of the Ru content to the sum of the O content and the N content (Ru/(O+N)) is 30 or less, the hydrogen resistance of the phase shift film 13 can be improved. The ratio of the Ru content to the sum of the O content and the N content (Ru/(O+N)) is preferably greater than 0.8 and less than or equal to 30, more preferably greater than 0.8 and less than 11.3, more preferably 1-11, even more preferably 2-10.5, especially preferably 2-10, and most preferably 2.2-8.

When the first element X1 is Ir and the second element X2 is O and N, a ratio of a Ru content (at %) to a sum of an O content (att) and a N content (at %) (Ir/(O+N)) is, for example, 1-25. When the ratio of the Ru content to the sum of the O content and the N content (Ir/(O+N)) is 1 or more, the crystallization of the phase shift film 13 can be suppressed and the roughness of the sidewall of the opening pattern 13a can be reduced. When the ratio of the Ru content to the sum of the 0 content and the N content (Ir/(O+N)) is 25 or less, the hydrogen resistance of the phase shift film 13 can be improved. The ratio of the Ru content to the sum of the O content and the N content (Ir/(O+N)) is preferably 1-25, more preferably 2-20, even more preferably 2.5-17, especially preferably 4-16, and most preferably 6-12.

The phase shift film 13 has a full width at half maximum (FWHM) of 1.0° or more of the highest intensity peak in the range of a diffraction angle (2θ) of 20°-50° by an X-ray diffraction (XRD) method using a Cukα line. The out-of-plane approach is used for the XRD method. If the full width at half maximum (FWHM) is 1.0° or more, the crystallinity of the phase shift film 13 is low and the roughness of the sidewall of the opening pattern 13a can be reduced. The full width at half maximum (FWHM) is preferably 2.0° or more, more preferably 3.0° or more, and particularly preferably 4.0° or more. The full width at half maximum (FWHM) is preferably greater, and distinct peaks are preferably absent.

The refractive index n of the phase shift film 13 is, for example, 0.930 or less, preferably 0.920 or less, more preferably 0.915 or less, even more preferably 0.910 or less, and especially preferably 0.900 or less. In addition, the refractive index n is preferably 0.885 or more. In the specification of the present application, the refractive index is a refractive index to light with a wavelength of 13.5 nm.

The extinction coefficient k of the phase shift film 13 is, for example, 0.015 or more, preferably 0.020 or more, more preferably 0.025 or more, even more preferably 0.030 or more, especially preferably 0.035 or more, and most preferably 0.040 or more. Moreover, the extinction coefficient k is preferably 0.065 or less. In the specification of the present application, the extinction coefficient is an extinction coefficient for light with a wavelength of 13.5 nm.

For the optical properties (refractive index n and extinction coefficient k) of the phase shift film 13, values in the database of the Center for X-Ray Optics, Lawrence Berkeley National Laboratory, or values calculated from a formula of "incident angle dependence" of reflectance, which will be described later, will be used.

The incident angle θ of the EUV light, the reflectance R for the EUV light, the refractive index n of the phase shift film 13, and the extinction coefficient k of the phase shift film 13 satisfy the following equation (1), $$R = \left| \frac{\sin\theta - ((n+ik)^2 - \cos^2\theta)^{1/2}}{\sin\theta + ((n+ik)^2 - \cos^2\theta)^{1/2}} \right|. \quad (1)$$

Measurements are made for the combination of the incident angle θ and the reflectance R a plurality of times, and the refractive index n and extinction coefficient k are estimated by the least squares method so that errors between the plural measurement data and the values of the equation (1) are minimized.

An etching rate of the phase shift film 13 by sulfuric acid/hydrogen peroxide is 0 nm/min-0.05 nm/min due to sulfuric acid/hydrogen peroxide. Sulfuric acid/hydrogen peroxide is used for removing a resist film, which will be described later, or cleaning the reflective mask 2. When the etching rate of the phase shift film 13 by sulfuric acid/hydrogen peroxide is 0.05 nm/min or less, damage to the phase shift film 13 during cleaning can be suppressed.

The deposition method of the phase shift film 13 is, for example, a DC sputtering method, magnetron sputtering method, or ion beam sputtering method. An oxygen content of the phase shift film 13 can be controlled by a content of $O_2$ gas in sputtering gas. In addition, a nitrogen content of the phase shift film 13 can be controlled by a content of Na gas in the sputtering gas.

The etching mask film 14 is formed on the phase shift film 13, and is used to form an opening pattern 13a in the phase shift film 13. A resist film (not shown) is formed on the etching mask film 14. In the manufacturing process of the reflective mask 2, a first opening pattern is formed on the resist film, then a second opening pattern is formed on the etching mask film 14 using the first opening pattern, and then a third opening pattern 13a is formed on the phase shift film 13 using the second opening pattern. The first opening pattern, the second opening pattern, and the third opening pattern 13a have identical dimensions and identical 16 shapes in a plan view (viewed along the Z-axis direction). The etching mask film 14 enables thinning of the resist film.

The etching mask film 14 contains at least one element selected from the fourth group consisting of aluminum (Al), hafnium (Hf), yttrium (Y), chromium (Cr), niobium (Nb), titanium (Ti), molybdenum (Mo), tantalum (Ta), and silicon (Si). In addition to the above elements, the etching mask film 14 may contain at least one element selected from the fifth group consisting of O, N, and B.

The film thickness of the etching mask film 14 is preferably 2 nm-30 nm, more preferably 2 nm-25 nm, and even more preferably 2 nm-10 nm.

The deposition method of the etching mask film 14 is, for example, a DC sputtering method, magnetron sputtering method, or ion beam sputtering method.

Next, a method of manufacturing the reflective mask blank 1 according to the embodiment of the present invention will be described with reference to FIG. 8. The method of manufacturing the reflective mask blank 1 has, for example, steps S101 to S105 shown in FIG. 8. A substrate 10 is prepared (step S101). A multilayer reflective film 11 is formed on a first main surface 10a of the substrate 10 (step S102). A protection film 12 is formed on the multilayer reflective film 11 (step S103). A phase shift film 13 is formed on the protection film 12 (step S104). An etching mask film 14 is formed on the phase shift film 13 (step S105).

The manufacturing method of the reflective mask blank 1 is required to have at least steps S101 to S104. The manufacturing method of the reflective mask blank 1 may further include a step of forming a functional film (not shown in FIG. 8).

Next, a method of manufacturing the reflective mask 2 according to the embodiment of the present invention will be described with reference to FIG. 9. The method of manufacturing the reflective mask 2 has steps S201 to S204 shown in FIG. 9. A reflective mask blank 1 is prepared (step S201). An etching mask film 14 is processed (step S202). A resist film (not shown) is provided on the etching mask film 14. A first opening pattern is formed on the resist film, then a second opening pattern is formed on the etching mask film 14 using the first opening pattern. A third opening pattern 13a is formed on the phase shift film 13 using the second opening pattern (step S203). In step S203, the phase shift film 13 is etched using etching gas. The resist film and the etching mask film 14 are removed (step S204). The resist film is removed using, for example, sulfuric acid/hydrogen peroxide. The etching mask film 14 is removed using, for example, etching gas. The etching gas used in step S204 (to remove the etching mask film 14) may be the same type as the etching gas used in step S203 (to form the opening pattern 13a). The manufacturing method of the reflective mask 2 is required to have at least steps S201 and S203.

EXAMPLES

In the following, the experimental data will be described with reference to TABLES 1 to 4. TABLES 1 to 2 show deposition conditions of phase shift films. TABLES 3 to 4 show results of measurement for characteristics of the phase shift films. Examples 1 to 12 and Examples 15 to 39 below are practical examples, and Examples 13 and 14 are comparative examples.

TABLE 1

| | | Deposition condition | | | | | |
|---|---|---|---|---|---|---|---|
| | Film type | Element X1 | Power density [W/cm$^2$] | Element X3 | Power density [W/cm$^2$] | O$_2$ gas concentration [vol %] | N$_2$ gas concentration [vol %] |
| Ex. 1 | RuTaON | Ru | 8.8 | Ta | 0.41 | 6 | 21 |
| Ex. 2 | RuTaON | Ru | 7.7 | Ta | 0.55 | 6 | 21 |
| Ex. 3 | RuTaON | Ru | 8.8 | Ta | 0.41 | 2 | 22 |
| Ex. 4 | RuTaON | Ru | 8.8 | Ta | 0.41 | 4 | 21 |
| Ex. 5 | RuTaON | Ru | 7.7 | Ta | 0.55 | 2 | 22 |
| Ex. 6 | RuTaON | Ru | 7.7 | Ta | 0.55 | 4 | 21 |
| Ex. 7 | PtTaO | Pt | 2.5 | Ta | 0.99 | 20 | 0 |
| Ex. 8 | RuCrON | Ru | 6.9 | Cr | 5.20 | 20 | 20 |
| Ex. 9 | RuMoON | Ru | 4.9 | Mo | 0.50 | 0.70 | 50 |
| Ex. 10 | RuMoON | Ru | 4.9 | Mo | 1.50 | 0.70 | 50 |
| Ex. 11 | RuMoON | Ru | 4.9 | Mo | 0.50 | 0.50 | 80 |
| Ex. 12 | RuMoON | Ru | 4.9 | Mo | 1.50 | 0.50 | 80 |
| Ex. 13 | RuCrON | Ru | 6.9 | Cr | 3.50 | 20 | 20 |
| Ex. 14 | RuON | Ru | 6.9 | — | — | 20 | 20 |
| Ex. 15 | RuTaON | Ru | 2.4 | Ta | 0.31 | 21 | 16 |
| Ex. 16 | RuTaON | Ru | 2.4 | Ta | 0.31 | 24 | 15 |
| Ex. 17 | RuTaON | Ru | 2.4 | Ta | 0.45 | 21 | 16 |
| Ex. 18 | RuTaO | Ru | 2.4 | Ta | 0.19 | 30 | 0 |
| Ex. 19 | RuTaO | Ru | 2.4 | Ta | 0.14 | 29 | 0 |
| Ex. 20 | RuWON | Ru | 5.0 | W | 0.50 | 1 | 20 |

TABLE 2

| | | Deposition condition | | | | | |
|---|---|---|---|---|---|---|---|
| | Film type | Element X1 | Power density [W/cm$^2$] | Element X3 | Power density [W/cm$^2$] | O$_2$ gas concentration [vol %] | N$_2$ gas concentration [vol %] |
| Ex. 21 | RuWON | Ru | 5.0 | W | 1.49 | 2 | 20 |
| Ex. 22 | RuWO | Ru | 5.0 | W | 0.50 | 2 | 0 |
| Ex. 23 | RuWON | Ru | 5.0 | W | 0.50 | 2 | 20 |
| Ex. 24 | RuWON | Ru | 5.0 | W | 1.49 | 3 | 0 |
| Ex. 25 | RuWO | Ru | 5.0 | W | 0.99 | 4 | 0 |
| Ex. 26 | RuWO | Ru | 5.0 | W | 0.99 | 4 | 0 |
| Ex. 27 | RuHfON | Ru | 6.9 | Hf | 1.66 | 8 | 20 |
| Ex. 28 | RuHfON | Ru | 6.9 | Hf | 1.66 | 10 | 20 |
| Ex. 29 | RuHfON | Ru | 4.1 | Hf | 4.28 | 6 | 21 |
| Ex. 30 | IrTaON | Ir | 4.1 | Ta | 3.04 | 2 | 22 |
| Ex. 31 | IrTaON | Ir | 4.1 | Ta | 2.49 | 2 | 22 |
| Ex. 32 | IrTaON | Ir | 4.1 | Ta | 1.93 | 2 | 22 |
| Ex. 33 | IrTaON | Ir | 4.1 | Ta | 1.38 | 2 | 22 |
| Ex. 34 | IrTaON | Ir | 4.1 | Ta | 0.83 | 2 | 22 |
| Ex. 35 | IrTaON | Ir | 4.1 | Ta | 0.55 | 2 | 22 |
| Ex. 36 | IrCrON | Ir | 5.5 | Cr | 3.18 | 8 | 20 |
| Ex. 37 | RuCrON | Ru | 6.2 | Cr | 1.50 | 6 | 21 |
| Ex. 38 | RuCrON | Ru | 3.7 | Cr | 2.50 | 6 | 21 |
| Ex. 39 | RuCrO | Ru | 3.7 | Cr | 2.00 | 3 | 21 |

TABLE 3

| | Film type | Composition | | | | Crystallinity Full width at half maximum [degrees] | Chemical shift | | After hydrogen exposure | |
| | | X1 [at %] | X3 [at %] | X2(N) [at %] | X2(O) [at %] | | ΔE1 [eV] | ΔE3 [eV] | O [at %] | Amount of change [at %] |
|---|---|---|---|---|---|---|---|---|---|---|
| Ex. 1 | RuTaON | 90 | 1 | 5 | 4 | 1.44 | 0.1 | 2.4 | 4 | 0 |
| Ex. 2 | RuTaON | 89 | 1 | 5 | 5 | 2.15 | 0.1 | 2.7 | 5 | 0 |
| Ex. 3 | RuTaON | 95 | 1 | 2 | 2 | 1.08 | 0.1 | 3.0 | 2 | 0 |
| Ex. 4 | RuTaON | 93 | 1 | 4 | 2 | 1.30 | 0.0 | 3.3 | 2 | 0 |
| Ex. 5 | RuTaON | 91 | 2 | 3 | 4 | 1.42 | 0.1 | 2.9 | 4 | 0 |
| Ex. 6 | RuTaON | 90 | 2 | 4 | 4 | 2.00 | 0.2 | 3.3 | 4 | 0 |
| Ex. 7 | PtTaO | 79 | 1 | 0 | 20 | 1.88 | 0.0 | 3.1 | 20 | 0 |
| Ex. 8 | RuCrON | 33 | 17 | 7 | 43 | N.D. | 0.2 | 2.1 | 43 | 0 |
| Ex. 9 | RuMoON | 87 | 5 | 6 | 2 | 1.51 | 0.0 | 0.2 | 2 | 0 |
| Ex. 10 | RuMoON | 81 | 13 | 4 | 2 | 3.30 | 0.0 | 0.3 | 2 | 0 |
| Ex. 11 | RuMoON | 81 | 11 | 2 | 6 | 3.01 | 0.0 | 0.3 | 6 | 0 |
| Ex. 12 | RuMoON | 75 | 17 | 2 | 6 | 4.70 | 0.0 | 0.4 | 6 | 0 |
| Ex. 13 | RuCrON | 15 | 25 | 3 | 57 | N.D. | 0.3 | 2.2 | 37 | −20 |
| Ex. 14 | RuON | 41 | 0 | 4 | 55 | N.D. | 0.3 | 0.0 | 0 | −55 |
| Ex. 15 | RuTaON | 75 | 4 | 5 | 16 | 5.27 | 0.0 | 3.8 | 16 | 0 |
| Ex. 16 | RuTaON | 71 | 4 | 5 | 20 | 8.55 | 0.1 | 4.3 | 21 | 0 |
| Ex. 17 | RuTaON | 74 | 5 | 5 | 16 | 4.91 | 0.0 | 3.5 | 15 | 0 |
| Ex. 18 | RuTaO | 82 | 4 | 0 | 14 | 1.54 | 0.1 | 3.9 | 14 | 0 |
| Ex. 19 | RuTaO | 86 | 3 | 0 | 11 | 1.44 | 0.0 | 3.2 | 11 | 0 |
| Ex. 20 | RuWON | 80 | 9 | 6 | 5 | 4.35 | 0.0 | 3.5 | 5 | 0 |

TABLE 4

| | Film type | Composition | | | | Crystallinity Full width at half maximum [degrees] | Chemical shift | | After hydrogen exposure | |
| | | X1 [at %] | X3 [at %] | X2(N) [at %] | X2(O) [at %] | | ΔE1 [eV] | ΔE3 [eV] | O [at %] | Amount of change [at %] |
|---|---|---|---|---|---|---|---|---|---|---|
| Ex. 21 | RuWON | 65 | 18 | 10 | 7 | 6.21 | 0.1 | 3.8 | 6 | 0 |
| Ex. 22 | RuWO | 80 | 10 | 0 | 10 | 1.09 | 0.0 | 2.8 | 10 | 0 |
| Ex. 23 | RuWON | 77 | 6 | 7 | 10 | 5.01 | 0.0 | 3.2 | 10 | 0 |
| Ex. 24 | RuWON | 65 | 22 | 0 | 13 | 1.10 | 0.1 | 4.0 | 13 | 0 |
| Ex. 25 | RuWO | 71 | 13 | 0 | 16 | 1.76 | 0.0 | 3.5 | 16 | 0 |
| Ex. 26 | RuWO | 70 | 12 | 0 | 18 | 1.54 | 0.0 | 3.5 | 18 | 0 |
| Ex. 27 | RuHfON | 84 | 2 | 6 | 8 | 3.94 | 0.1 | 1.7 | 8 | 0 |
| Ex. 28 | RuHfON | 78 | 2 | 8 | 12 | 7.81 | 0.0 | 1.8 | 12 | 0 |
| Ex. 29 | RuHfON | 60 | 16 | 5 | 19 | 5.70 | 0.2 | 2.9 | 19 | 0 |
| Ex. 30 | IrTaON | 69 | 23 | 5 | 3 | 1.90 | 0.2 | 1.2 | 3 | 0 |
| Ex. 31 | IrTaON | 75 | 18 | 4 | 3 | 1.64 | 0.1 | 1.3 | 3 | 0 |
| Ex. 32 | IrTaON | 78 | 15 | 3 | 4 | 1.63 | 0.0 | 1.3 | 4 | 0 |
| Ex. 33 | IrTaON | 82 | 9 | 2 | 7 | 1.35 | 0.0 | 1.9 | 7 | 0 |
| Ex. 34 | IrTaON | 85 | 4 | 3 | 8 | 1.09 | 0.1 | 1.7 | 8 | 0 |
| Ex. 35 | IrTaON | 91 | 3 | 2 | 4 | 1.00 | 0.0 | 1.7 | 4 | 0 |
| Ex. 36 | IrCrON | 62 | 16 | 5 | 17 | 2.25 | 0.0 | 1.5 | 17 | 0 |
| Ex. 37 | RuCrON | 75 | 6 | 8 | 11 | N.D. | 0.2 | 1.0 | 11 | 0 |
| Ex. 38 | RuCrON | 72 | 13 | 9 | 6 | N.D. | 0.2 | 0.3 | 6 | 0 |
| Ex. 39 | RuCrO | 63 | 26 | 0 | 11 | N.D. | 0.2 | 0.3 | 11 | 0 |

Example 1

In Example 1, an EUV mask blank including a substrate, a multilayer reflective film, a protection film, and a phase shift film was fabricated. As the substrate, a $SiO_2$—$TiO_2$-based glass substrate (outer shape: a square of 6 inches (152 mm) per side and 6.3 mm thick) was prepared. The glass substrate had a thermal expansion coefficient of $0.02 \times 10^{-7}$/° C. at 20° C., a Young's modulus of 67 GPa, a Poisson's ratio of 0.17, and a specific stiffness of $3.07 \times 10^7$ m²/s². A quality-guaranteed region of a first main surface of the substrate had a root-mean-square roughness (Rq) of 0.15 nm or less and a flatness of 100 nm or less by polishing. A Cr film with a thickness of 100 nm was deposited on a second main surface of the substrate by the magnetron sputtering method. A sheet resistance of the Cr film was 100 Ω/□.

As the multilayer reflective film, a Mo/Si multilayer reflective film was formed. The Mo/Si multilayer reflective film was formed by repeating 40 times deposition of a Si layer (film thickness was 4.5 nm) and a Mo layer (film thickness was 2.3 nm) using the ion beam sputtering method. The total film thickness of the Mo/Si multilayer reflective film was 272 nm ((4.5 nm+2.3 nm)×40).

As the protection film, a Rh film (film thickness was 2.5 nm) was formed. The Rh film was formed using the DC sputtering method. The reflectance of EUV light by the multilayer reflective film after forming the protection film, that is, a reflectance of the first EUV light L1 shown in FIG. 3, was 64.5% at the maximum.

As the phase shift film, a RuTaON film was formed. The RuTaON film was formed using the reactive sputtering method. The deposition conditions for the RuTaON film were as follows:

Targets: Ru target and Ta target;
Power density of Ru target: 8.8 W/cm$^2$;
Power density of Ra target: 0.41 W/cm$^2$;
Sputtering gas: a mixture of Ar gas, $O_2$ gas and $N_2$ gas;
Volume ratio of $O_2$ gas to the sputtering gas ($O_2/(Ar+O_2+N_2)$): 0.06; and
Volume ratio of $N_2$ gas to the sputtering gas ($N_2/(Ar+O_2+N_2)$): 0.21.

Example 2 to Example 39

In Example 2 to Example 39, EUV mask blanks were fabricated under the same conditions as in Example 1 except for the deposition conditions of the phase shift film. The deposition conditions of the phase shift film are shown in TABLES 1 to 2, and measurement results of the characteristics of the phase shift film are shown in TABLES 3 to 4.

Evaluation

The composition of the phase shift film was measured using an X-ray photoelectron spectrometer (PHI 5000 VersaProbe) by ULVAC-PHI, Inc. The compositions of the phase shift film were measured before and after exposing the phase shift film to hydrogen gas, respectively. Concentrations of the elements before the hydrogen exposure, the O concentration after the hydrogen exposure, and an amount of change in the O concentration due to the hydrogen exposure are shown in TABLES 3 to 4. The hydrogen exposure was carried out by attaching a test piece having a square shape of 2.5 cm per side cut from the test sample to a Si dummy substrate, setting the dummy substrate in a hydrogen irradiation test apparatus simulating the EUV exposure apparatus, and irradiating the dummy substrate with hydrogen (including hydrogen ions).

Figure 7:
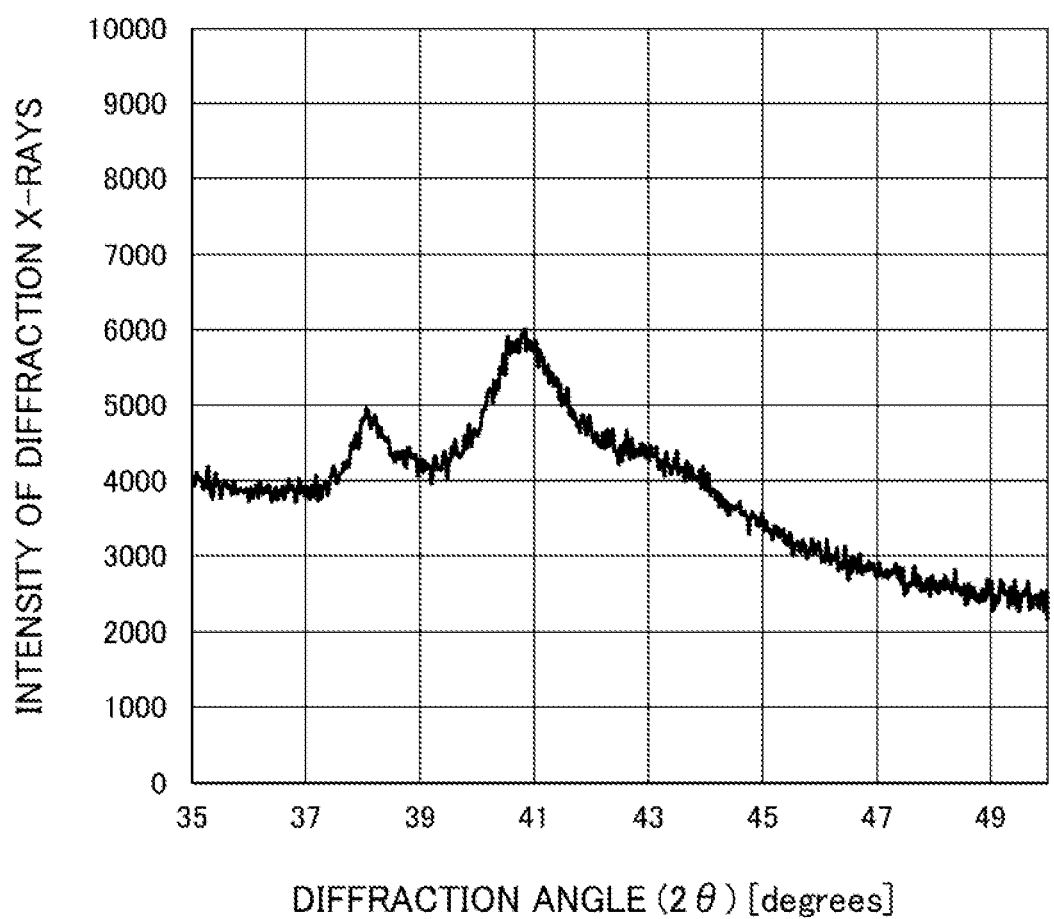
FIG. 7 is a diagram showing an X-ray diffraction (XRD) spectrum of the phase shift film of Example 1.

The crystallinity of the phase-shifted film was measured using an X-ray diffraction instrument (MiniFlex II, by Rigaku Corporation). In TABLE 3, "N.D." of the full width at half maximum represents that no clear peak was observed in the range of the diffraction angle (2θ) of 20°-50°. As a typical example, the X-ray diffraction spectrum of Example 1 is shown in FIG. 7.

Figure 5:
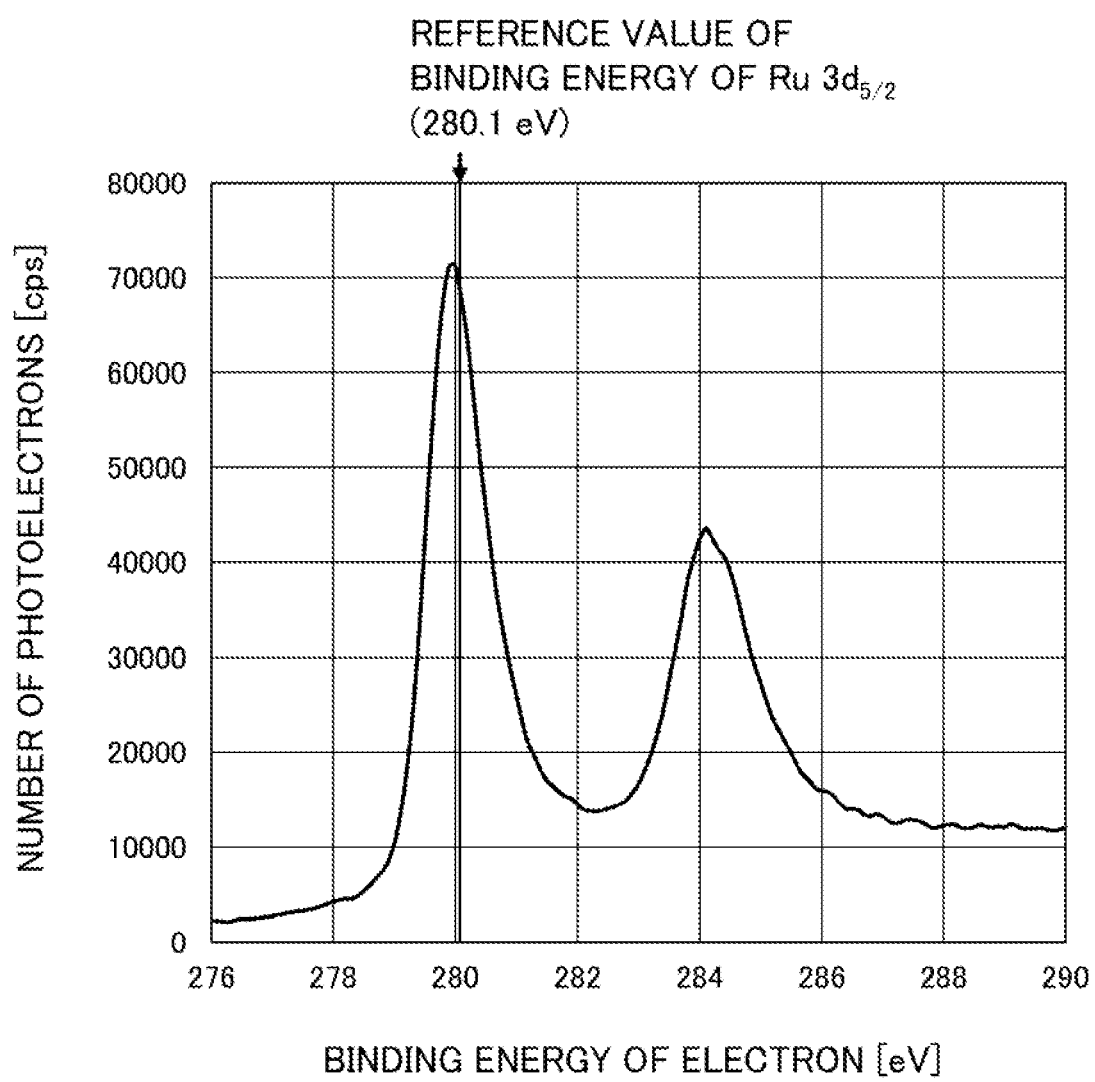
FIG. 5 is a diagram showing a chemical shift of Ru contained in a phase shift film of Example 1.
Figure 6:
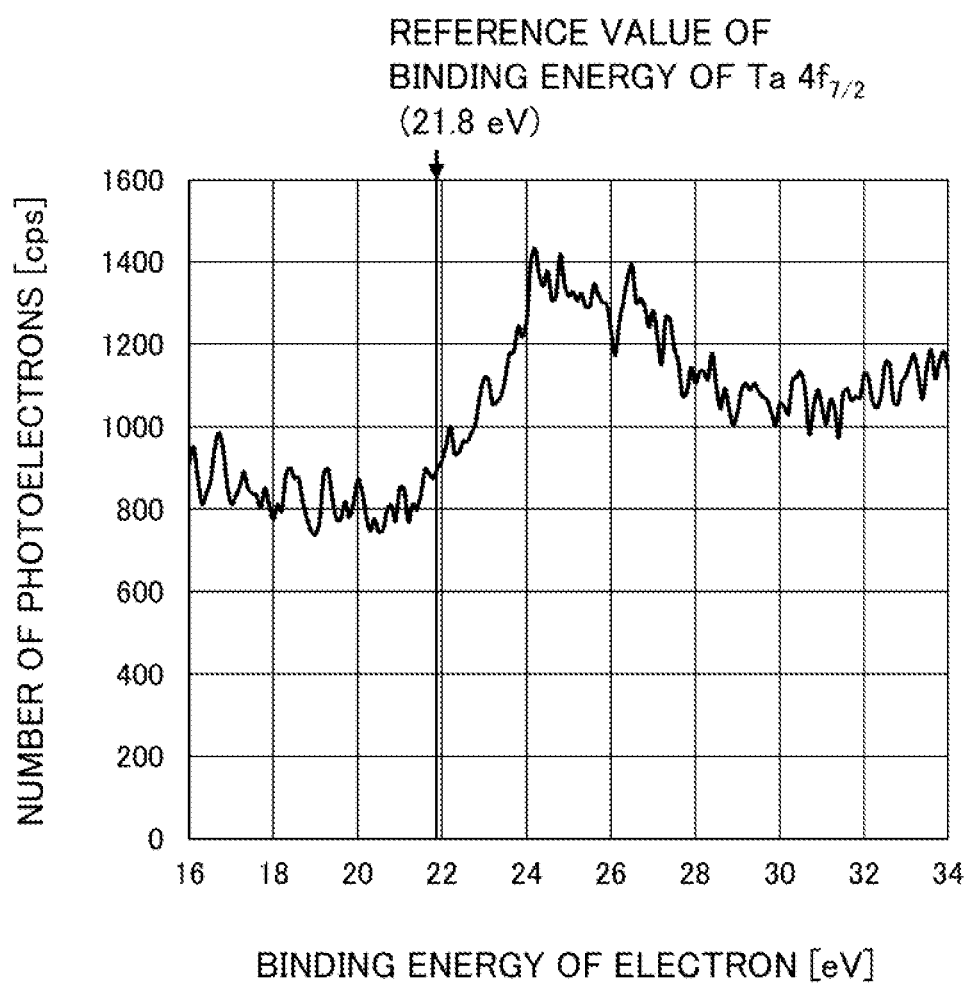
FIG. 6 is a diagram showing a chemical shift of Ta contained in the phase shift film of Example 1.

The chemical shift of the phase shift film was measured using the X-ray photoelectron spectrometer (PHI 5000 VersaProbe, by ULVAC-PHI) for each sample according to the above-described procedure. The chemical shift is a magnitude (absolute value) of a difference between a binding energy of the largest peak of the actually observed spectrum and the reference binding energy, or a magnitude of a difference between a binding energy of the lowest observed peak and a binding energy of the highest observed peak among the peaks of the same level obtained when the peak separation is performed for the observed spectrum. As typical examples, the chemical shift of Ru contained in the phase shift film of Example 1 is shown in FIG. 5, and the chemical shift of Ta contained in the phase shift film of Example 1 is shown in FIG. 6. In FIG. 5, although the binding energy of the actually observed peak was 0.1 eV lower than the reference binding energy, such difference is considered to be within an error range.

As shown in TABLES 3 to 4, in Examples 1 to 12 and Examples 15 to 39, the chemical shift ΔE1 of the first element X1 (Ru, Pt, or Ir) was less than 0.3 eV and the chemical shift ΔE3 of the third element X3 (Ta, Cr, Mo, W, or Hf) was greater than ΔE1, and thus a decrease in the O concentration due to the hydrogen exposure was not observed. In addition, in Examples 1 to 7, Examples 9 to 12, and Examples 15 to 36, the full width at half maximum (FWHM) was 1.0° or more, and thus the crystallinity of the phase shift film was sufficiently low.

According to Example 13, although the chemical shift ΔE3 of the third element X3 (Cr) was greater than the chemical shift ΔE1 of the first element X1 (Ru), the chemical shift ΔE1 was 0.3 eV or more and a decrease in the O concentration due to the hydrogen exposure was observed. Therefore, it is found to be important to keep the chemical shift ΔE1 below 0.3 eV in order to improve the hydrogen resistance of the phase shift film.

According to Example 14, not only the chemical shift ΔE1 of the first element X1 (Ru) is 0.3 eV or more, but also the third element X3 is not contained, and thus the O concentration is greatly reduced by the hydrogen exposure. Therefore, it is found that the inclusion of the third element X3 and further the chemical shift ΔE3 of the third element X3 being greater than the chemical shift ΔE1 of the first element X1 contribute to the improvement of the hydrogen resistance of the phase shift film.

As described above, the reflective mask blank, the reflective mask, the method of manufacturing the reflective mask blank, and the method of manufacturing the reflective mask according to the present disclosure have been described. However, the present disclosure is not limited to the above-described embodiments, and the like. Various variations, modifications, substitutions, additions, deletions, and combinations are possible within the scope of claims. They also of course fall within the technical scope of the present disclosure.

What is claimed is:

1. A reflective mask blank comprising:
   a substrate;
   a multilayer reflective film that reflects EUV light;
   a protection film that protects the multilayer reflective film; and
   a phase shift film that shifts a phase of the EUV light, the substrate, the multilayer reflective film, the protection film, and the phase shift film being arranged in this order,
   wherein the phase shift film contains at least one first element X1 selected from the first group consisting of ruthenium (Ru), iridium (Ir), platinum (Pt), palladium (Pd), and gold (Au), at least one second element X2 selected from the second group consisting of oxygen (O), boron (B), carbon (C), and nitrogen (N), and a third element X3 whose standard Gibbs energy of formation of at least one of an oxide, boride, carbide, and nitride is less than or equal to −130 kJ/mol, and
   in the phase shift film, a chemical shift of a peak of 3d5/2 or a peak of 4f7/2 of the first element X1 observed by X-ray electron spectroscopy is less than 0.3 eV, and a chemical shift of a peak of the third element X3 observed by X-ray electron spectroscopy is greater than the chemical shift of the peak of the first element X1.

2. The reflective mask blank according to claim 1, wherein the standard Gibbs energy of formation of at least one of an oxide, boride, carbide, and nitride of the third element X3 is less than or equal to −500 kJ/mol, and
in the phase shift film, a chemical shift of a peak of the third element X3 observed by X-ray spectroscopy is greater than or equal to 1.0 eV.

3. The reflective mask blank according to claim 1, wherein the phase shift film contains at least one second element X2 selected from the second group consisting of oxygen (O), boron (B), and carbon (C).

4. The reflective mask blank according to claim 3, wherein the phase shift film contains 1 at % or more and less than 55 at % of oxygen (O).

5. The reflective mask blank according to claim 1, wherein the phase shift film contains 40 at % or more and 98 at % or less in total of the first element X1, 1 at % or more and 59 at % or less in total of the second element X2, and 1 at % or more and 30 at % or less in total of the third element X3.

6. The reflective mask blank according to claim 1, wherein the third element X3 is at least one selected from the third group consisting of tantalum (Ta), niobium (Nb), molybdenum (Mo), chromium (Cr), silicon (Si), hafnium (Hf), tungsten (W), and rhenium (Re).

7. The reflective mask blank according to claim 1, wherein the third element X3 is at least one selected from the third group consisting of tantalum (Ta), chromium (Cr), and tungsten (W).

8. The reflective mask blank according to claim 1, wherein the first element X1 is Ru and the third element X3 is Cr, a ratio of a Ru content (at %) to a Cr content (at %) (Ru/Cr) is 1-13.

9. The reflective mask blank according to claim 1, wherein the phase shift film has a full width at half maximum of 1.0° or more of a highest intensity peak in a range of a diffraction angle (2θ) of 20° or more and 50° or less by an X-ray diffraction (XRD) method using a CuKα line.

10. The reflective mask blank according to claim 1, wherein a film thickness of the phase shift film is 20 nm or more and 60 nm or less.

11. The reflective mask blank according to claim 1, wherein the protection film contains at least one element selected from ruthenium (Ru), rhodium (Rh), and silicon (Si).

12. The reflective mask blank according to claim 1 further comprising an etching mask film on the phase shift film,
wherein the etching mask film contains at least one element selected from the fourth group consisting of aluminum (Al), hafnium (Hf), yttrium (Y), chromium (Cr), niobium (Nb), titanium (Ti), molybdenum (Mo), tantalum (Ta), and silicon (Si).

13. The reflective mask blank according to claim 12, wherein the etching mask film further contains at least one element selected from the fifth group consisting of O, N, and B.

14. A reflective mask comprising the reflective mask blank according to claim 1, wherein the reflective mask has an opening pattern.

15. A method of manufacturing a reflective mask blank comprising:
forming a multilayer reflective film on a substrate, the multilayer reflective film reflecting EUV light;
forming a protection film on the multilayer reflective film, the protection film protecting the multilayer reflective film; and
forming a phase shift film on the protection film, the phase shift film shifting a phase of the EUV light,
wherein the phase shift film contains at least one first element X1 selected from the first group consisting of ruthenium (Ru), iridium (Ir), platinum (Pt), palladium (Pd), and gold (Au), at least one second element X2 selected from the second group consisting of oxygen (O), boron (B), carbon (C), and nitrogen (N), and a third element X3 whose standard Gibbs energy of formation of at least one of an oxide, boride, carbide, and nitride is less than or equal to −130 kJ/mol, and
in the phase shift film, a chemical shift of a peak of 3d5/2 or a peak of 4f7/2 of the first element X1 observed by X-ray electron spectroscopy is less than 0.3 eV, and a chemical shift of a peak of the third element X3 observed by X-ray electron spectroscopy is greater than the chemical shift of the peak of the first element X1.

16. A method of manufacturing a reflective mask, comprising:
preparing the reflective mask blank manufactured by using the method of manufacturing a reflective mask blank according to claim 15; and
forming an opening pattern in the phase shift film.

* * * * *